(12) United States Patent
Takeuchi et al.

(10) Patent No.: US 7,313,022 B2
(45) Date of Patent: Dec. 25, 2007

(54) NON-VOLATILE SEMICONDUCTOR MEMORY

(75) Inventors: Ken Takeuchi, Tokyo (JP); Tamio Ikehashi, Kamakura (JP); Toshihiko Himeno, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 291 days.

(21) Appl. No.: 11/032,165

(22) Filed: Jan. 11, 2005

(65) Prior Publication Data

US 2005/0125595 A1    Jun. 9, 2005

Related U.S. Application Data

(63) Continuation of application No. 10/698,484, filed on Nov. 3, 2003, now Pat. No. 6,970,388, which is a continuation of application No. 09/968,983, filed on Oct. 3, 2001, now Pat. No. 6,646,930.

(30) Foreign Application Priority Data

Oct. 3, 2000    (JP)    ............................. 2000-304003

(51) Int. Cl.
*G11C 16/04*    (2006.01)
(52) U.S. Cl. .............................. 365/185.09; 365/185.11
(58) Field of Classification Search ........... 365/185.09, 365/185.11, 185.01
See application file for complete search history.

(56) References Cited

U.S. PATENT DOCUMENTS 4,451,903 A * 5/1984 Jordan .......................... 365/94

6,052,313 A * 4/2000 Atsumi et al. .......... 365/189.05
6,462,985 B2 * 10/2002 Hosono et al. ......... 365/185.09

FOREIGN PATENT DOCUMENTS

| JP | 3-208146 | 9/1991 |
|---|---|---|
| JP | 5-216771 | 8/1993 |
| JP | A-06-131892 | 5/1994 |
| JP | 7-334999 | 12/1995 |
| JP | 8-44628 | 2/1996 |
| JP | A-08-030515 | 2/1996 |
| JP | A-08-221993 | 8/1996 |
| JP | A-10-125093 | 5/1998 |
| JP | A-2000-163988 | 6/2000 |

* cited by examiner

*Primary Examiner*—Vu A. Le
(74) *Attorney, Agent, or Firm*—Oblon, Spivak, McClelland, Maier & Neustadt, P.C.

(57) ABSTRACT

A non-volatile semiconductor memory device includes a memory cell array having a plurality of non-volatile memory cells, a decode circuit configured to decode address data as input thereto to select a memory cell from the memory cell array, and a data sense circuit configured to detect and amplify the data of the selected memory cell of the memory cell array. The memory cell array includes an initial setup data region with initial setup data and status data being programmed thereinto. The initial setup data is used for determination of memory operating conditions, and the status data indicates whether the initial setup data region is presently normal or not in functionality.

18 Claims, 18 Drawing Sheets

NON-VOLATILE SEMICONDUCTOR MEMORY

CROSS REFERENCE TO RELATED APPLICATION

This application is based on and claims the benefit of priority under 35 USC §119 from the prior Japanese Patent Application No. 2000-304003, filed on Oct. 3, 2000, and under 35 USC §120 from U.S. application Ser. No. 09/968,983, now U.S. Pat. No. 6,970,388 filed Oct. 3, 2001 and U.S. continuation application Ser. No. 10/698,484, filed Nov. 3, 2003, now U.S. Pat. No. 6,646,930 the entire contents of each of which are incorporated herein by reference in their entirety.

BACKGROUND OF THE INVENTION

1. Field of the Invention

This invention relates to non-volatile semiconductor memory devices.

2. Description of the Related Art

Currently available large-scale semiconductor memory devices are typically designed to come with built-in redundancy circuitry which permits relieving the device including defects, if any. The same goes with electrically erasable programmable read-only memory (EEPROM) chips. With standard redundancy circuit designs, a redundant row cell array and redundant column cell array are provided in addition to an ordinary or standard cell array. Also provided is fuse circuitry which stores therein defect addresses and detects whether an externally supplied address coincides with the presently stored defect address for controlling address replacement or substitution. The fuse circuitry is typically designed to employ an array of laser-blown type fuses.

The fuse circuit is also used to write or "program" a variety of kinds of initial setup data for determination of the operating conditions of a memory chip, in addition to defect address data for defect repairing purposes. Examples of such initial setup data include, but not limited to, data for adjustment of voltages as internally produced on a chip in accordance with fabrication process parameter irregularities, setup data of a write voltage(s), and control parameters of the requisite number of write/erase control loops.

Unfortunately, the fuse circuit lacks functional flexibilities due to the fact that it will hardly permit any re-programming once after having programmed in a certain way. Another disadvantage is that extraction of defective portions through a test at the stage of wafer test/inspection and laser blowout process must be done separately at different process steps. Additionally these are hardly implementable as a series of continuous steps.

A currently proposed approach to avoiding the problems is to employ as an initial setup data storage circuit in place of the fuse elements an array of electrically rewritable non-volatile memory cells which are the same as those used in EEPROMs. Employing such non-volatile memory cells makes data writing easier when compared to traditional fuse blowout techniques, while enabling establishment of rewriting or "reprogramming" of the data.

However, one prior known scheme is for disposing the non-volatile memory cell array for storage of the initial setup data in a specific region that is kept separate from a "main" memory cell array. With this scheme, storing initial setup data does require the use of separate or "extra" rewrite/read circuitry in addition to the main memory cell array's inherent rewrite/read circuitry, which would result in an increase in complexity of circuit configuration while increasing the resultant chip area. Another problem faced with the prior art is the difficulty in operation control procedure due to the necessity of verification and correction after once having written the initial setup data.

BRIEF SUMMARY OF THE INVENTION

The non-volatile semiconductor memory device in accordance with one aspect of the invention includes a memory cell array having a plurality of non-volatile memory cells, a decode circuit configured to decode address data as input thereto to select a memory cell from the memory cell array, and a data sense circuit configured to detect and amplify the data of the selected memory cell of the memory cell array. The memory cell array includes an initial setup data region with initial setup data being programmed thereinto. The initial setup data is used for determination of memory operating conditions.

DETAILED DESCRIPTION OF THE INVENTION

Figure 1:
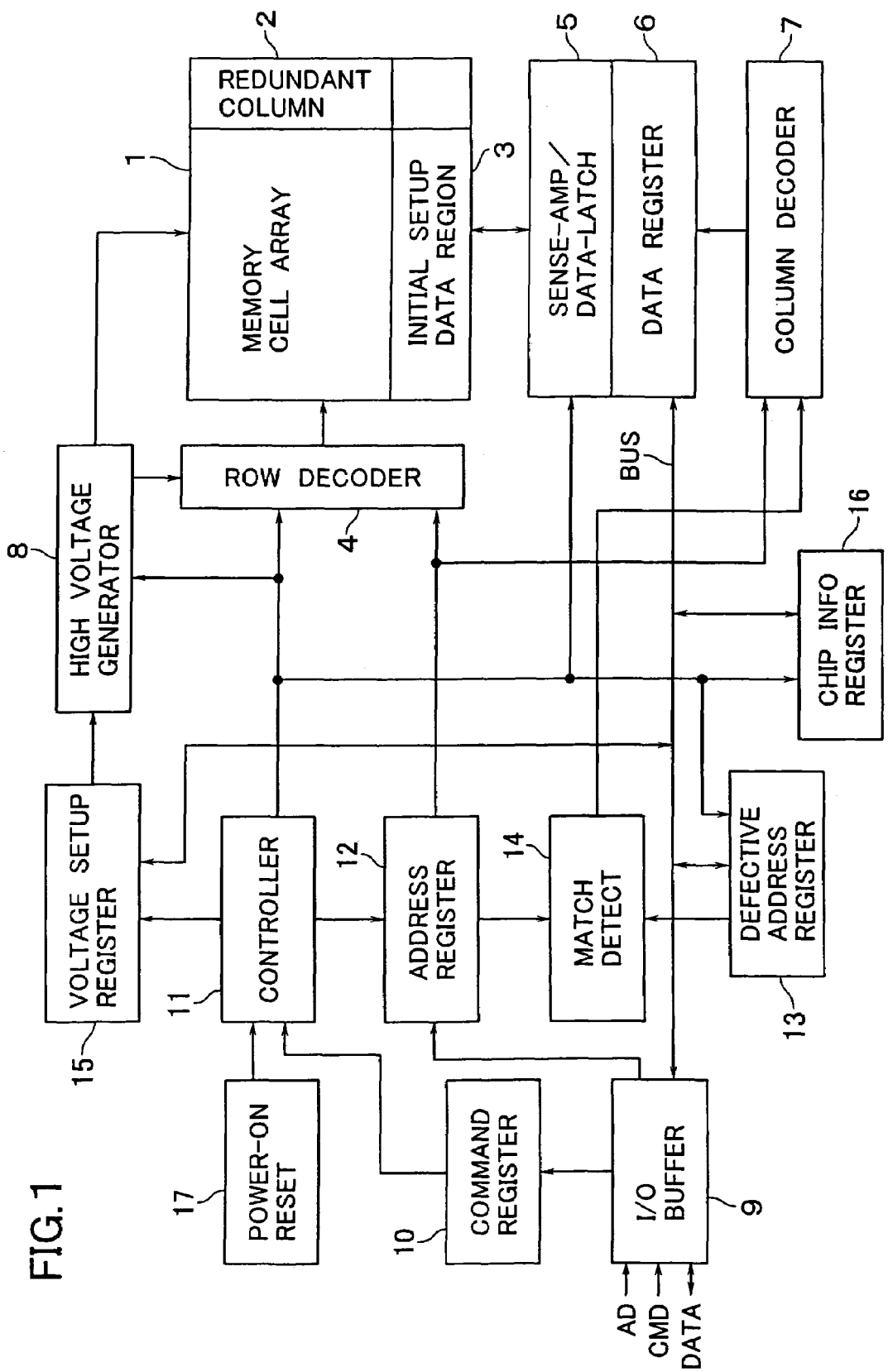
FIG. 1 is a diagram showing a configuration in block form of an EEPROM in accordance with one embodiment of this invention.

Referring now to FIG. 1, there is shown a configuration of an electrically erasable and programmable read-only memory (EEPROM) chip of the so-called NAND cell type in accordance with one embodiment of this invention. As shown herein, this EEPROM chip includes a memory cell array 1 which is made up of rows and columns of electrically rewritable non-volatile memory cells as disposed in a matrix form. A respective one of these memory cells has a stacked-gate metal oxide semiconductor (MOS) transistor structure with a floating gate and a control gate being insulatively stacked over each other. The memory cell array 1 also includes, in addition to its normal cell array, a redundant column cell array 2 for replacement or "substitution" of a defective cell or cells, if any. Also provided in the memory cell array 1 is a specific data storage region 3, into which initial setup or "prestore" data for determination of operating conditions of the memory is written. This storage region 3 will be referred to hereinafter as the initial setup data region or simply initialization data region, or more simply, "ini" data region.

Figure 2:
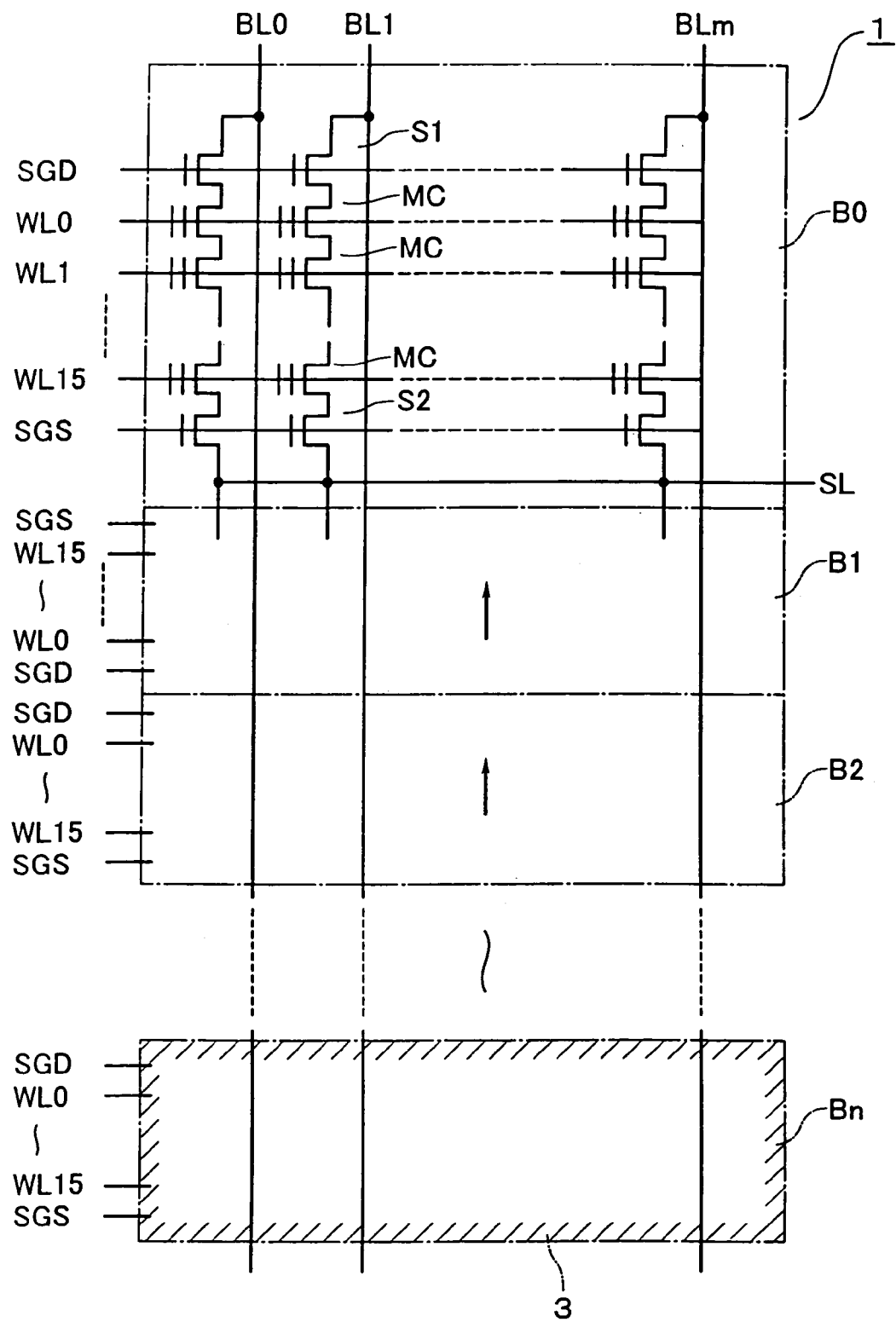
FIG. 2 is a diagram showing equivalent circuitry of a memory cell array used in the embodiment shown in FIG. 1.

Turning to FIG. 2, there is depicted an equivalent circuit of the memory cell array 1. In this example, a series connection of sixteen (16) memory cells MC make up a NAND cell unit. A plurality of NAND cell units with a word line WL connected in common thereto constitute a cell block for use as a minimal unit for data erase. In FIG. 2, cell blocks B0, B1, . . . , Bn are shown, wherein parallel bit lines BL0, BL1, . . . , BLm are provided in common for these cell blocks. One or a plurality of cell blocks of these cell blocks will be used as the initialization or "ini" data region 3 shown in FIG. 1. The cell block configuration of FIG. 2 assumes that cell block Bn is designed for use set as the ini data region 3.

Conventionally, a memory cell region selected by one word line in the memory cell array 1 is called as 1 (one) page. However, in the illustrative embodiment, the ini data region 3 is divided into "even-numbered page" region and "odd-numbered page" region that are defined by bit lines. The even-numbered page region is defined as a range that is selectable by even-numbered bit lines (BLE) as included in multiple parallel bit lines BL associated with the memory cell array 1; the odd-numbered page region is defined as a range selectable by odd-numbered bit lines (BLO). This will be set forth in detail later in the description.

Figure 3A:
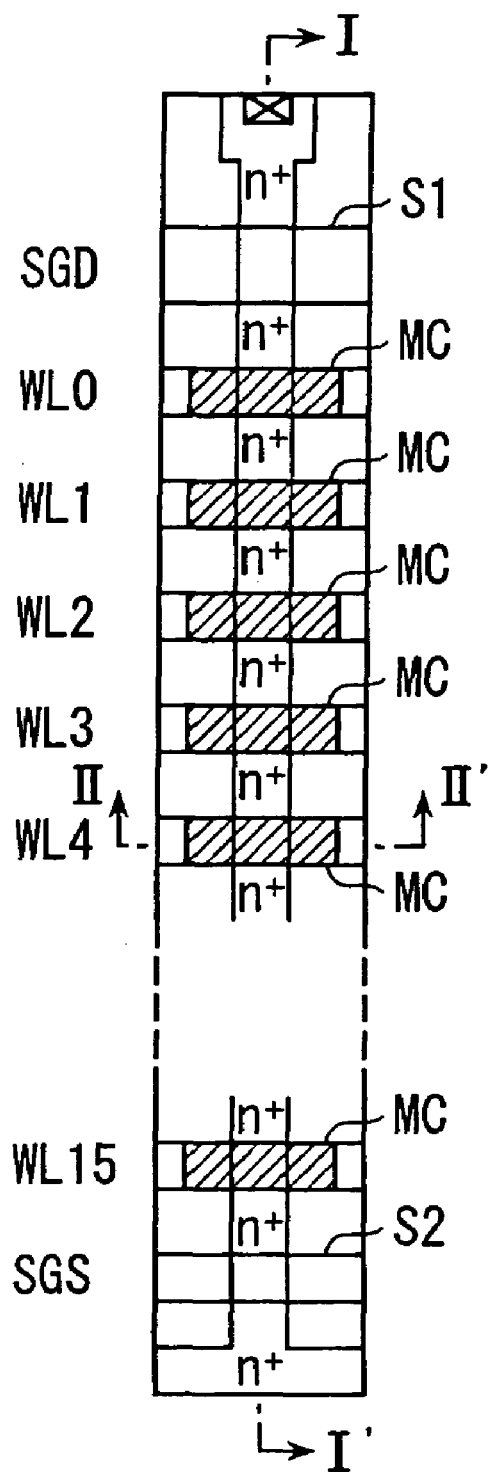
FIG. 3A depicts a plan view of a NAND cell unit in the memory cell array of FIG. 2.
Figure 3B:
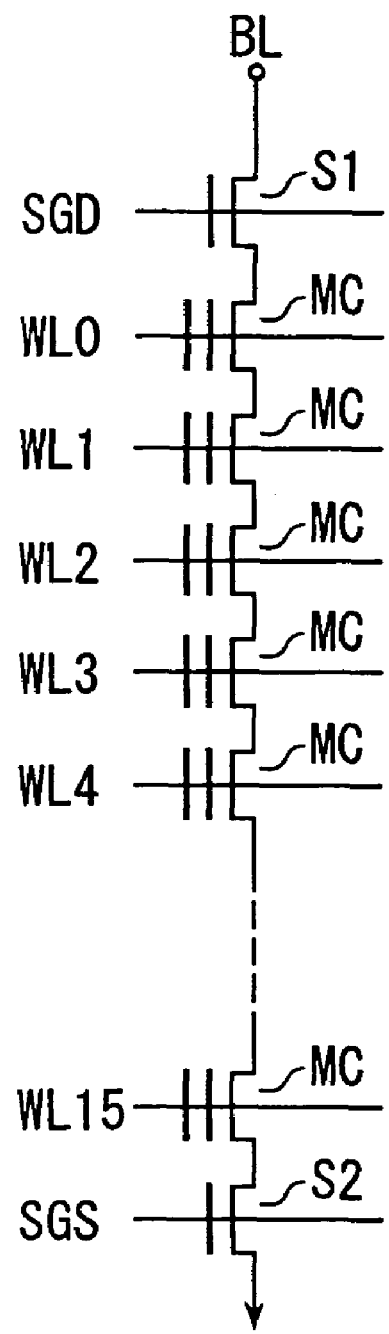
FIG. 3B is an equivalent circuit thereof.
Figure 4A:
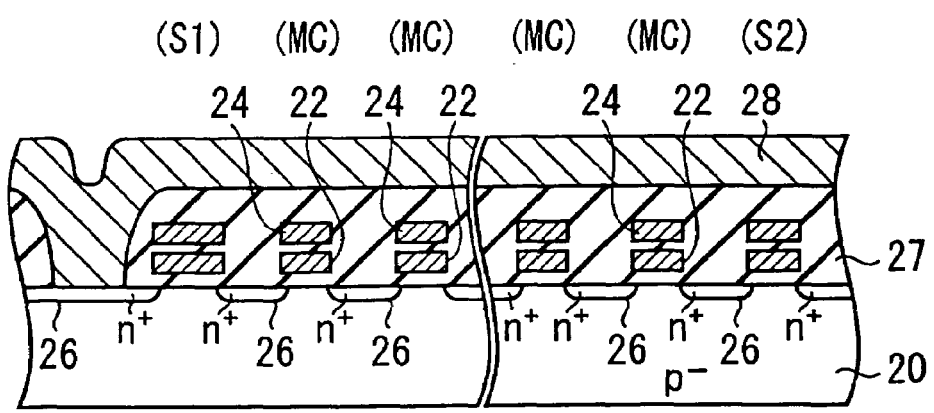
FIGS. 4A and 4B are cross-sectional views of the NAND cell unit as taken along lines I-I' and II-II' of FIG. 3A, respectively.
Figure 4B:
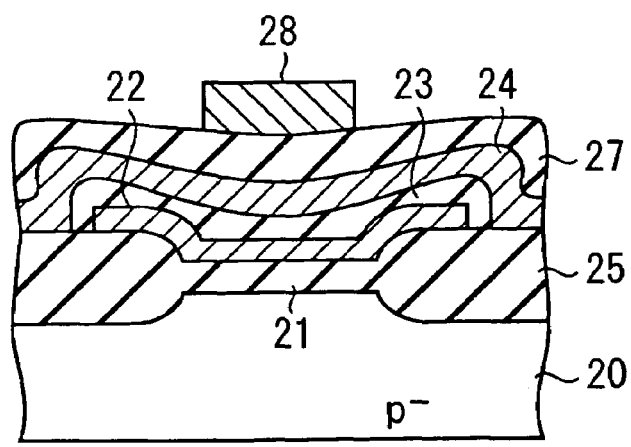

See FIG. 3A, which shows the layout of a single NAND cell unit. Also see FIG. 3B which depicts the equivalent circuit thereof. A longitudinal cross-sectional structure of the NAND unit as taken along line I-I' of FIG. 3A is shown in FIG. 4A whereas a transverse sectional view of it along line II-II' of FIG. 3A is illustrated in FIG. 4B. The NAND cell unit includes memory cells MC which are formed within an element fabrication region of a p-type silicon substrate 20 as partitioned by an element isolation dielectric film 25. Each memory cell MC has a floating gate 22 that is formed in the element fabrication region with a tunneling dielectric film 21 interposed therebetween, and a control gate 24 insulatively overlying the floating gate 22 with an insulator film 23 being sandwiched between these gates.

The sixteen memory cells MC within the NAND cell unit are serially connected together in such a manner that adjacent cells commonly share source/drain diffusion layers 26. The NAND cell unit has one terminate end which is electrically connected via a select gate transistor S1 to a corresponding one of the bit lines BL and an opposite end which is coupled via another select gate transistor S2 to a common source line SL. Control gates 24 of the memory cells MC are continuously disposed and aligned in one direction, forming a word line WL. Each select gate transistor S1, S2 has insulatively stacked gate electrodes having a multilayer structure similar to that of memory cell MC. A difference between the select gate transistor and memory cell transistor is that the former lacks the floating gate separation or isolation, which is available in the latter. More specifically, the select transistors S1, S2 are such that their multilayer gate electrodes are disposed continuously in the same direction as the word lines WL thus providing select gate lines SGD, SGS. An interlayer dielectric film 27 is formed to cover the cell array, with parallel bit lines (BL) 28 being formed thereon as shown in FIGS. 4A-4B.

One or a plurality of appropriate blocks of the above-discussed cell blocks in the memory cell array 1 thus arranged is/are defined as the ini data storage region 3 that stores therein the initial setup data. While ini data region 3 is capable of executing data write, erase and read operations through selection and driving of bit and word lines BL and WL, this region is not accessible externally during ordinary operations of the EEPROM. Accordingly, this ini data region 3 will no longer be set in any erase condition during either the so-called "all-at-a-time" data erasing or selective erase in units of cell blocks also. Details of this ini data region 3 will be discussed later.

The bit lines BL of the memory cell array 1 are electrically connected via a data sense circuit 5 to a data register 6 as shown in FIG. 1. The data sense circuit 5 functions to sense and amplify read data while also acting as a data latch for latching write data. For selection of a bit line BL and word line WL of the memory cell array 1, a column decoder 7 and row decoder 4 are provided. An address AD, data DATA and command CMD are input through an input/output (I/O) buffer 9 as shown in FIG. 1. The address AD is accepted or "imported" at an address register 12; command CMD is at a command register 12; write data DATA is at a data register 6.

Row address data and column address data as output from the address register 12 are decoded by the row decoder 4 and the column decoder 7 respectively, thereby attaining memory cell selection. A variety of kinds of high potential level voltages, referred to hereinafter as "high-level" voltages or simply "high" voltages, for use during data writing and erasing operations are produced by a high-voltage generation circuit 8 which may be formed of potential rise-up or "booster" circuitry. The command as accepted or accommodated into the command register 10 is then decoded by a control circuit 11, which in turn performs sequential control of data write and erase operations.

During data writing, control is provided in such a way as to first write data into a presently selected memory cell or cells, then perform a "verify-read" operation for verifying the completeness of resultant data-written state, and thereafter execute writing again with respect to a write-deficient memory cell(s), if any. Similarly, in data erase event also, control is provided in such a way as to first erase data in a selected memory block(s), then perform a verify-read operation for verification of the resulting erase state, and thereafter again perform erasing an erase-deficient memory block (s) if any. It is the control circuit 11 that performs such a series of write or erase control operations based on the settings of a write mode or erase mode.

The initial setup data written into the ini data region 3 of memory cell array 1 may be data items made apparent through execution of wafer test/inspection processes. Typical examples thereof are as follows: (1) defect address data indicative of the address of a defective cell, (2) various control data of data write/erase events, such as voltage data, write/erase control loop number or the like, (3) chip information including but not limited to codes concerning the memory's storage capacity and/or specifications and a chip manufacturer identification (ID) code. A detailed explanation as to an operation for writing these initial setup data items into the ini data region 3 will be presented later.

In the EEPROM with the initial setup data having been stored in the ini data region 3 of memory cell array 1 in this way, initialization of its operating conditions gets started automatically upon power-on or alternatively in response to receipt of a certain command, and is executed through readout of the initial setup data as written in the ini data region 3. This setting of the memory's initial state based on the data read out of the ini data region 3 is done by an operating condition setup circuit, which is made up of a defect address register 13 that stores a defective cell address or addresses, a voltage setup register 15 for storing control data used for control of the high-voltage generator circuit 8, and a chip information register 16 for storage of chip information, as shown in FIG. 1. Reading data from this ini data region 3 and controlling transfer of read data toward the respective registers 13, 15 and 16 are automatically carried out by the control circuit 11.

More specifically, upon activation of electrical power, a power-on reset circuit 17 is rendered operative. The control circuit 11 detects this power-on and then permits establishment of a read mode after elapse of a prespecified length of time period for stabilization of the power supply voltage. Subsequently the control circuit 11 causes the address register 12 to generate and issue an internal address used to scan the ini data region 3, which address will be sequentially incremented. And, the data of ini data region 3 as selected by the row decoder 4 and column decoder 7 will be read by the data sense circuit 5 and then transferred via data buses BUS to the respective registers 13, 15 and 16 for initialization and next stored therein.

The initialization operation stated above may be modified so that the required control is done in response to an appropriate command as input thereto, rather than depending on the powerup detection.

Figure 5:
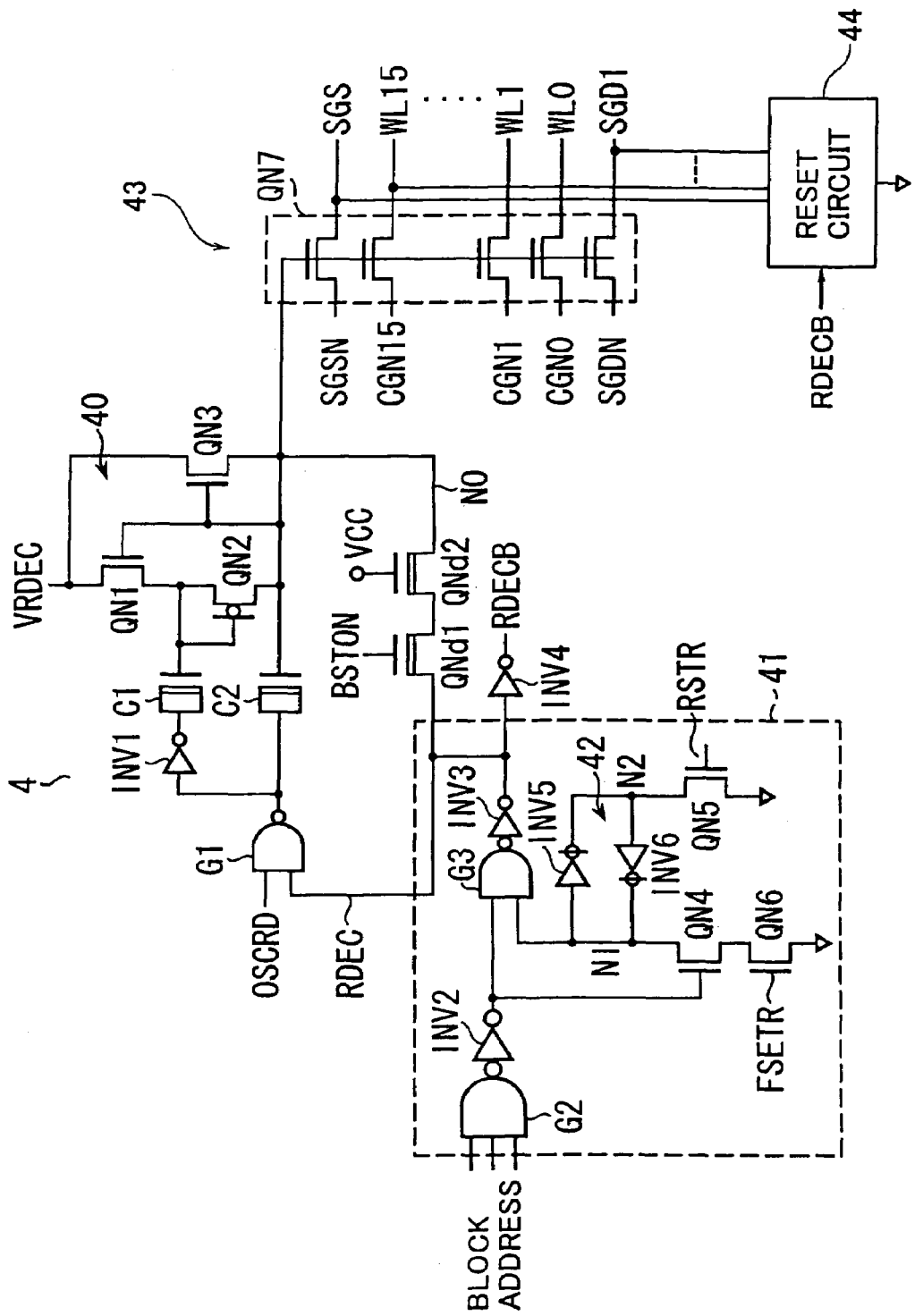
FIG. 5 is a diagram showing a configuration of a row decoder with latch functionality for use in the EEPROM.

Turning now to FIG. 5, there is shown a configuration of main part of the row decoder 4 for wordline selection and drive, which includes a block address selection circuit 41 and its associative wordline drive circuit 43 to be controlled in response to an output signal of the block address selector circuit 41. This block address selector 41 has a NAND gate G2 to which a block address is input. For a presently selected cell block, an output of the NAND gate G2 potentially goes low, i.e. its potential drops down at a low or "L" level. In responding thereto, a block select signal RDEC of high or "H" level will be output from selector 41.

The block address selector 41 includes a data latch circuit 42 that forces a defective cell block to be held in inactive state. This data latch 42 also has the function of the operating condition setter circuit for initialization of the operating conditions of the memory. More precisely, more than one defect address is to be stored in the ini data region 3 based on test/inspection results in a way as will be set forth in detail later. At the stage for initialization of the EEPROM chip, this is read out of it, causing flag data indicating that this is defective with respect to a defective cell block to be written into the data latch circuit 42.

A detailed explanation is as follows. Upon reading of the address of a defective cell block from the ini data storage region 3, the NAND gate G2 of a corresponding cell block issues an output of "L" level, thus causing an N-channel MOS (NMOS) transistor QN4 to turn on. Substantially simultaneously, an NMOS transistor QN6 turns on in response to receipt of a control signal FSETR, thereby permitting "L" to be held at a node N1 of the latch circuit 42. This state will be retained while the power supply is set to ON, whereby a NAND gate G3 is made inactive. In brief, even when a defective cell block address is input in the following memory operations, the select signal RDEC is potentially kept at "L" level. With regard to defect-free or "normal" cell blocks, the node N1 of latch circuit 42 is set at "H" level; thus, the NAND gate G3 is kept active. Whereby, upon inputting of a block address, control is provided letting the select signal RDEC potentially go high to reach "H" level.

In the case of the illustrative embodiment, column redundancy is executed in a way as will be described later; however, row redundancy is unavailable while merely causing the flag indicative of a defective cell block to be stored in the block address selector 41 within the row decoder. Consequently, during the practically implemented memory operation control procedure, a central processor unit (CPU), for example, is expected to automatically perform scan readout of all the memory cell arrays for detection of a defective cell block address(es) if any. This is followed by a write/read control operation to ensure that such defective cell block(s) is/are out of use. An alternative approach is to externally output the flag indicative of a defective cell block being presently held at the block address selector 41.

In FIG. 5, upon selection of a normal cell block, the select signal RDEC potentially goes high to have "H" level, which is then sent forth to a node N0 via depression (D) type NMOS transistors QNd1 and QNd2. A group of NMOS transistors QN7 as driven by this node N0 are for use as drive transistors that electrically drive select gate lines SGD, SGS and word lines WL0-WL15. Drive signal lines SGDN, CGN0-CGN15, SGSN are connected via these drive transistors QN7 to the select gate line SGD, word lines WL0-15 and select gate line SGS, respectively.

More specifically, if in the case of data writing, a high write voltage potential is applied to one selected by a row main decoder from among the drive signal lines CGN0-CGN15, while letting an intermediate or "midway" potential for write inhibition be given to more than one drive signal line closer to the bitline side than the selected line. In the case of data reading, a read voltage is given to one selected by the row main decoder from among drive signal lines CGN0-CGN15 while simultaneously applying a "pass" voltage to the remaining drive signal lines.

In case any cell block is not selected or, alternatively, it is a defective cell block, the select gate lines SGD, SGS and word lines WL0-15 are coupled to ground by a reset circuit 44. A signal DECB that is an output of the block address selector circuit 41 as has been inverted by an inverter INV4 is at "H" level in both non-selected or "unselect" cell blocks and a defective cell block(s), thereby rendering the reset circuit 44 operative.

An ensemble of NMOS transistors QN1-QN3, capacitors C1-C2, inverter INV1 and NAND gate G1 makes up a switch circuit 40 which is operable to transfer a voltage VRDEC to the node N0. One of power supply voltage VCC and a high voltage as output from a high voltage generator circuit 8 is selected and given to a VRDEC terminal. Upon selection of a cell block, the select signal RDEC of "H" level is transferred to the node N0, causing the NMOS transistor QN1 to turn on; thus, the voltage VRDEC is sent to node N0 through this NMOS transistor QN1 and diode-connected NMOS transistor QN2. An alternate current (AC) signal OSCRD is presently applied to the NAND gate G1. Accordingly, whenever NAND gate G1 is made active by RDEC="H," the capacitors C1-C2 are driven by the AC signal passed through NAND gate G1 in such a way that these capacitors are opposite in phase to each other. Whereby, the switch circuit 40 performs a voltage transfer operation due to charge-pumping.

As a result of this charge-pumping effect, a voltage slightly higher in potential than the voltage VRDEC, represented by "VRDEC+α" is given to the node N0. NMOS transistor QN3 is provided for prevention of any excessive increase in potential at node N0. In brief, the potential at node N0 is suppressed to be less than or equal to VRDEC+ Vth, where "Vth" is the threshold voltage of NMOS transistor QN3.

When the voltage VRDEC is transferred by the switch circuit 40 to the node N0, set a signal BSTON at zero (0) volts while causing the D-type NMOS transistor QNd1 to turn off. Whereby, the voltage VRDEC being given to node N0 is no longer sent to the output terminal side of block address selector circuit 41.

Figure 6:
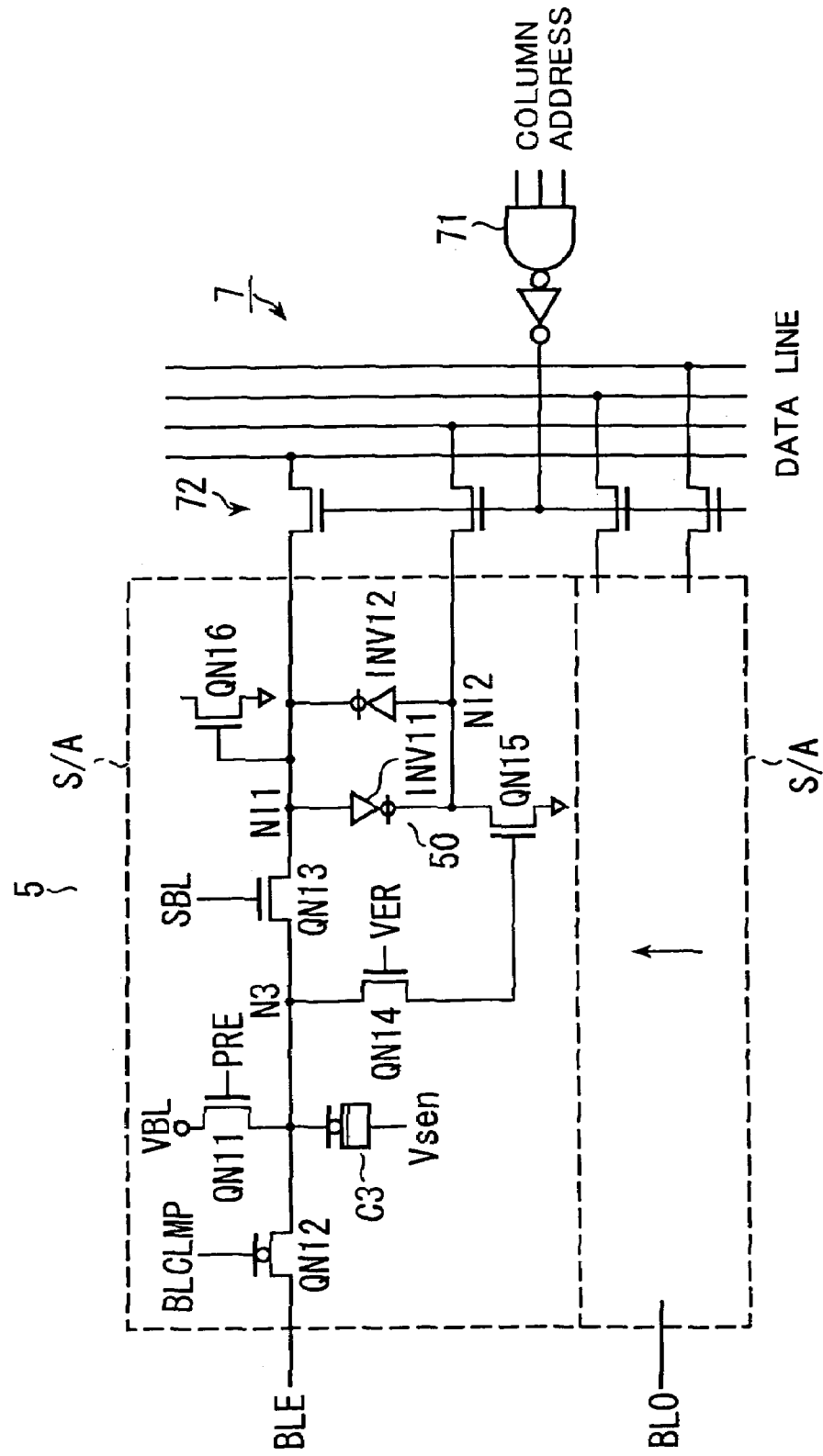
FIG. 6 is a diagram depicting a configuration of a data sense circuit used in the EEPROM.

See FIG. 6, which shows one exemplary configuration of the data sense circuit 5 of FIG. 1. Data sense circuit 5 is generally made up of a plurality of sense amplifiers S/A, each of which is provided at a respective one of the bit lines BL. Each sense amplifier S/A includes a data latch circuits 50 that is configured from two antiparallel-coupled clocked inverters INV11, INV12. This data latch circuit 5.0 and other similar data latch circuits of the remaining sense amps S/A (not shown in FIG. 6) constitute a page buffer (PB). A bit line BL associated with the sense amp S/A of FIG. 6 is connected via a clamping transistor QN12 to a node N3. This node N3 is coupled via an NMOS transistor QN13 to a node N11 of latch circuit 50.

There are provided at the node N3 a bitline-precharging NMOS transistor QN11 and a capacitor C3 for holding a voltage potential of node N3. Capacitor C3 is used to control the potential of node N3 by capacitive coupling when the need arises.

In a data write event, based on the data as held at the latch circuit 50, either "H" or "L" level of the node N11 is given to the bit line via transistors QN13 and QN12, thereby causing an NAND cell channel to be precharged in accordance with the data. During verify-reading of write data, a sensing NMOS transistor QN15 is used which is provided at a node N12 of latch 50. At this time a bitline potential as read to node N3 is given via NMOS transistor QN14 to the gate of NMOS transistor QN15. To be brief, NMOS transistor QN15 is controlled to turn on and off in response to the potential at node N3, thus determining whether the data being held at latch circuit 50 is inverted or is kept unchanged.

The nodes N11, N12 of sense amplifier S/A are connected to corresponding data lines through a column gate 72 that makes up the column decoder 7. Column gate 72 is controlled by an output of a decode gate 71, to which more than one column address is input.

A basic operation of the sense amplifier S/A thus arranged in the way stated above is as follows. Practically a data write operation is performed by repeated execution of a write pulse applying operation and a verify-read operation in order to force the data of interest to finally fall within a prespecified threshold voltage range. In this case the write data being presently held at the latch circuit 50 is controlled based on a later-obtainable verify-read data in a way such that upon completion of writing, the data is inverted in logic level while inhibiting or "disabling" any later-executed writing operations.

With the illustrative NAND-cell EEPROM embodying the invention, if in the case of storage of digital binary data, then store the high threshold voltage state of a memory cell (for example, positive threshold voltage state) as a logical "0" data bit; store a low threshold voltage state (e.g. negative threshold state) of the cell as logical "1" data. In this case, "L" is loaded to the sense amp S/A's node N11 if write data is a "0"; if write data is "1" then "H" is loaded thereto.

Then, in accordance with the data at node N11, either a source voltage VSS (when "0" is written) or power supply voltage VCC (when "1" is written) is given to the bit line via transistors QN13, QN12, thus precharging the NAND cell channel. Thereafter, a high voltage for data writing, i.e. high write voltage, is applied to a selected word line while at the same time applying an intermediate voltage to the remaining non-select or "unselect" word lines, thereby causing electrons to be injected by tunneling or "tunnel-injected" into the floating gate of a "0"-write memory cell, which results in its threshold voltage being positively offset. This is the "0" data programmed state. At memory cells with "1" written thereinto, such electron injection will hardly occur, resulting in the threshold voltage being kept unchanged.

After the writing operation, a verify-read operation is to be done. This verify-reading is the same in principle as ordinary read operations. Apply to a selected word line a voltage corresponding to a certain to-be-sensed threshold voltage while giving a pass voltage to the remaining unselect memory cells; then, detect the presence or absence of discharging at a bit line due to conduction or non-conduction of a selected memory cell. At this time the bitline's potential change is sent to the node N3 through the clamping transistor QN12. When this is done, the NMOS transistor QN13 is kept in the OFF state thereof.

In case the "0" write is done sufficiently, bitline discharging will no longer occur causing the node N3 to potentially go high at "H" level. At this time, when turning NMOS transistor QN14 on in response to receipt of a verify signal VER, NMOS transistor QN15 turns on due to "H" at node N3, causing "L" to be given to node N12. Thus the clocked inverters INV11, INV12 of latch circuit 50 which have been held in the inactive state until then are made active sequentially, whereby data with node N11="H" will be taken thereinto. In short, upon completion of "0" writing, the data as held at latch 50 is inverted.

In the case of "1" write and in the case "0" write is deficient, execution of verify-reading results in the node N3 being set at "L". Hence, the data of latch 50 is not inverted causing any memory cells into which "0" is to be further written to retain "L" while letting "1"-written cells hold "H". Whereby, a write pulse application operation will be further repeated with respect to only a write-deficient bit or bits.

An NMOS transistor QN16 having its gate connected to the node N11 of latch circuit 50 is for use as a verify-check transistor. This transistor QN16 is provided at the individual one of all the sense amplifiers S/A making up one page. In the event that node N11 potentially goes high and reaches "H" level after verify-read is done, this transistor QN16 turns on. Thus it becomes possible by detecting the state change of this transistor QN16 at all the sense amps S/A to successfully determine whether all the written data bits corresponding to one page are proper or not at a time.

Figure 7:
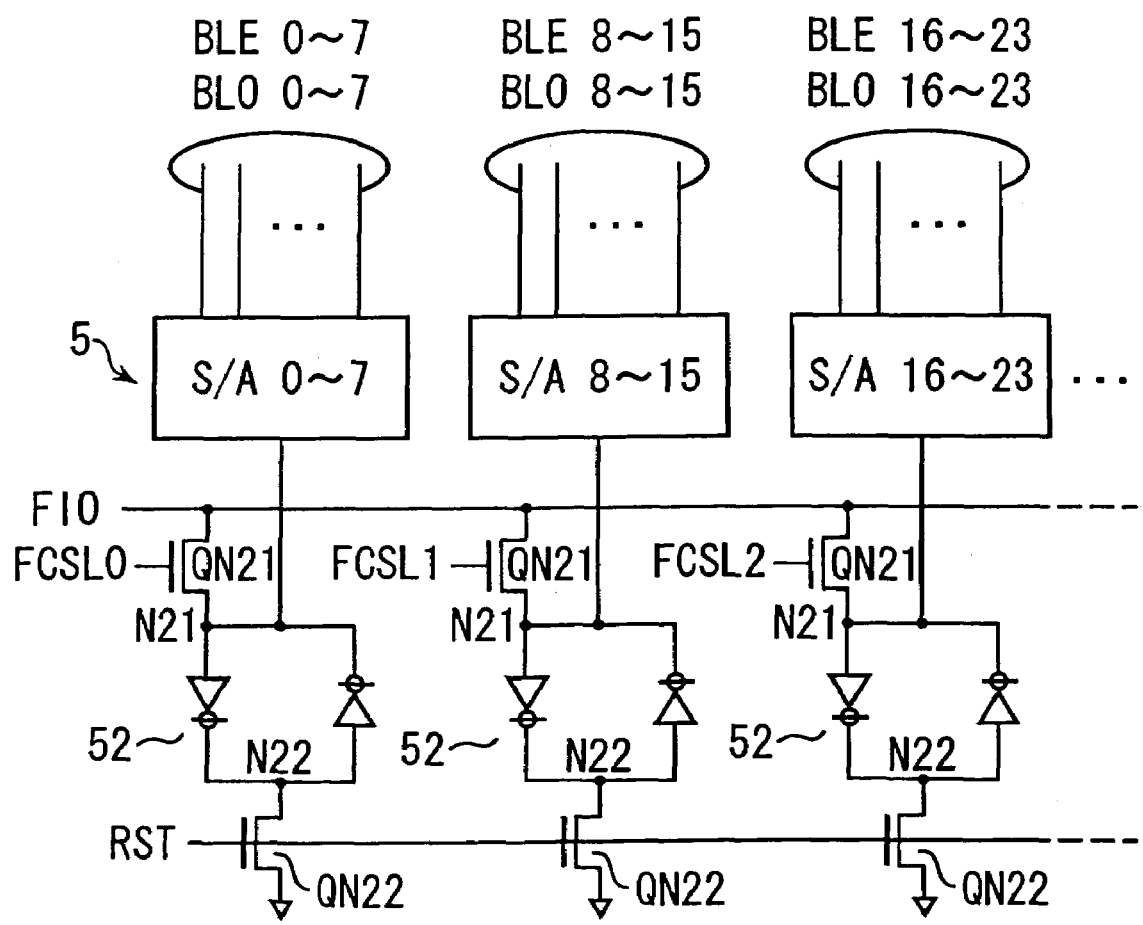
FIG. 7 is a diagram showing latch circuits operatively associated with the data sense circuit.

In this embodiment, a defective cell address if any is read at the stage of initialization of the EEPROM; at this time, control is done to make the sense amplifier S/A of a defective column inactive. To this end, as shown in FIG. 7, several data latch circuits 52 are provided for selectively making the sense amps S/A inactive. More specifically, under an assumption that parallel data bits are concurrently subject to read/write on a per-byte basis in response to one column address, the data latch circuits 52 are provided so that these are organized into groups or "clusters" each consisting of eight sense amps S/A0-7, S/A8-15, S/A16-23, ..., wherein each sense-amp cluster corresponds to a single column. Each data latch 52 is configured from an antiparallel connection of two clocked inverters. Data latch 52 has a node 21 at one end thereof, which is connected to an activation terminal of its corresponding one of the sense-amp clusters S/A0-7, S/A8-15, et seq. This node N21 is also coupled to a signal line FIO via an NMOS transistor QN21, which is expected to receive a defective column address FCSLi, where "i" is 0, 1, 2, .... Data latch 52 also has its remaining node N22, at which a reset NMOS transistor QN22 is provided.

Assume that a column address "0" is defective. If this is the case, FCSL0="H" is established during a chip initialization operation, causing "L" to be taken into the node N21 of latch circuit 52. This permits sense amplifiers S/A0-7 to stay in inactive state during power-on. As a consequence, this data latch 52 also makes up the above-noted operating condition setter circuitry for initializing "during-the-operation" requirements of the memory.

A detailed explanation will next be given of a configuration of the initialization ("ini") data storage region 3 as predefined within the memory cell array 1 of the EEPROM embodying the invention, along with its operation for initialization of such EEPROM.

Figure 8:
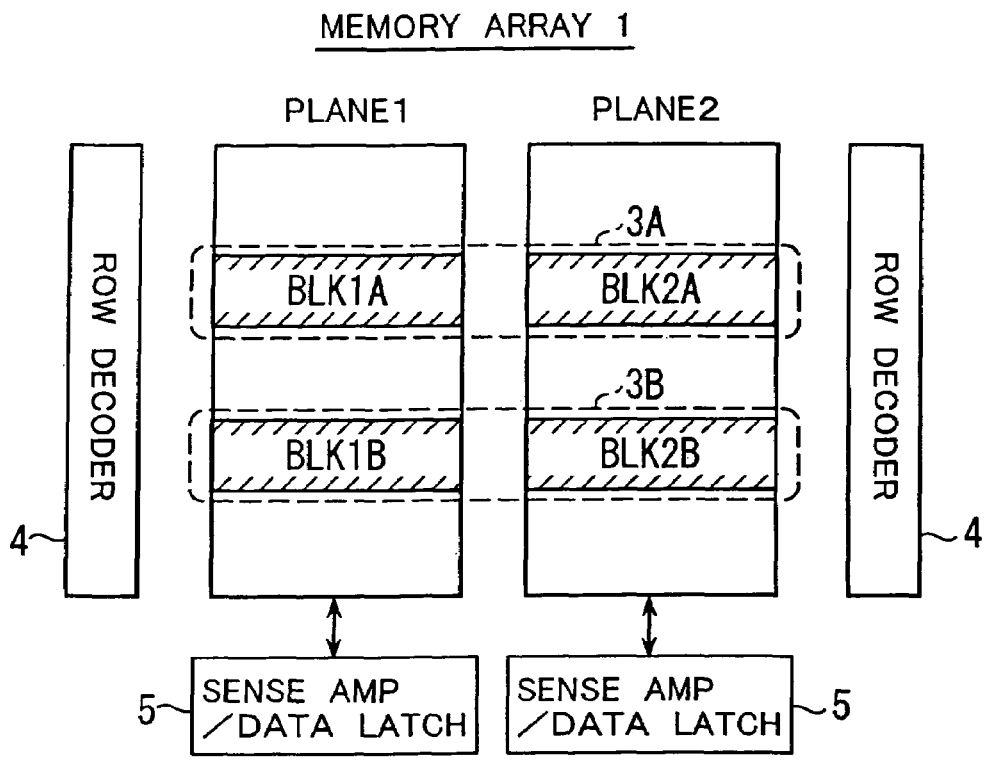
FIG. 8 is a pictorial representation of a layout of initial setup data storage blocks in the cell array of the embodiment, for explanation of a block layout method also embodying the invention.

As shown in FIG. 8, assume that the memory cell array 1 is subdivided into two portions, called "planes" PLANE1, PLANE2. Note here that these planes PLANE1, PLANE2 have mutually "independent" word lines which are selectable by executive row decoders 4 respectively, and also have data sense circuits 5 that are operable in a way independently of each other.

In the case of this embodiment shown herein, the ini data storage region 3 within the memory cell array 1 is designed to employ two, first and second data storage blocks 3A and 3B. The first ini data block 3A includes sub-blocks BLK1A, BLK2A in the planes PLANE1, PLANE2 respectively; the second ini data block 3B has its own sub-blocks BLK1B, BLK2B. Note here that these sub-blocks BLK1A, BLK2A, BLK1B, BLK2B each define the range of one block of memory cells for use as a unit of data erase within each plane PLANE1, PLANE2.

Each ini data block 3A, 3B is designed to extend along or "bridge" between the two planes PLANE1, PLANE2 for purposes of establishment of a sufficient storage capacity required for the ini data region 3. Such two ini data blocks 3A, 3B may be formed within a single plane, for example. Alternatively, even where the memory cell array is not divided into multiple planes, the principles of this invention is effective; in such case, two ini data blocks are formable within a single memory cell array thereof.

The same data will be programmed into the first ini data block 3A and the second ini data block 3B. Firstly, based on test results, status data indicative of whether these ini data blocks 3A, 3B are normal is stored in both of them. Further written as the initial setup data into these data blocks 3A, 3B other than this status data are optional data items which include defect address data and voltage setup data and others.

Although in practice only either one of these ini data blocks 3A, 3B is used, the two identical blocks are prepared with one as a duplicate kept in reserve in view of risks of defects. Specifically, if the first ini data block 3A is normal, then this will be used while letting the second ini data block 3B be out of use. Alternatively, if first data block 3A is found defective, then the data presently held at second block 3B will be used. In case first and second blocks 3A, 3B are both defective, the memory chip is rejected as a defective product. In this way, the use of two data blocks 3A, 3B with the same data written thereinto as the ini data region 3 makes it possible to attain enhanced repairability or "curability" even in the presence of any partial defects within ini data region 3.

Figure 9:
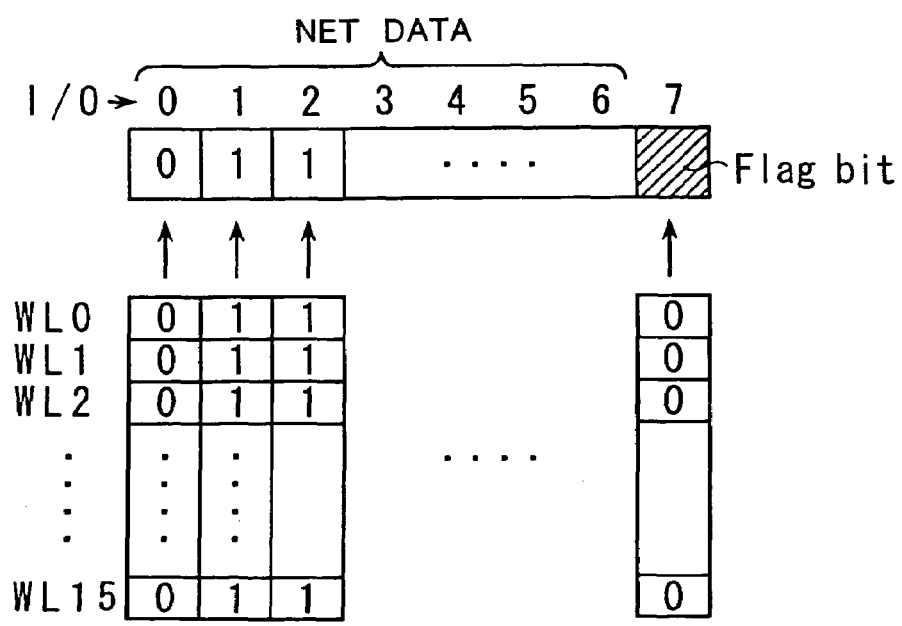
FIG. 9 is a pictorial representation for explanation of a data format of the initialization ("ini") data storage blocks.

Turning to FIG. 9, there is shown the format of data to be written into the first and second ini data blocks 3A, 3B. The initial setup data is such that a binary data bit (1-bit data) "0" or "1" is settled depending upon writing of all "0"s or all "1"s into sixteen memory cells of a single NAND cell unit as selected by word lines WL0-WL15. This is for increasing the reliability of such initial setup data. Reading data out of one of those memory cells making up the NAND cell unit is achievable by rendering the remaining memory cells conductive to thereby force them to act as data transfer or "pass-through" transistors. Due to this, the NAND cell unit is different in channel resistivity in accordance with the actually established data state, while staying less in margin of "0" or "1" data read signal. In contrast thereto, if an arrangement is employed for permitting storage of 1-bit data "0" or "1" depending upon whether the NAND cell unit is set in the all "0" state or in all "1" state, the resultant signal margin of "0" or "1" data increases, resulting in a likewise increase in reliability of the initial setup data.

Also note that the initial setup data is such that effective or "net" data is written into seven (7) bits of certain data terminals I/O0-6 as selected from 1-byte parallel data corresponding to eight (8) data terminals I/O0-7 while letting the remaining one (1) bit be used as a flag bit indicative of whether this data is valid or not. In the event that the flag bit is a logic "0", this data will be deemed valid; if "1" then this data is made invalid. The former case occurs when its corresponding NAND cell unit is in the all "0" state, which is equivalent to the write state with positive threshold voltage. The latter case takes place when the corresponding NAND cell unit is in the all "1" state, equivalent to the write state with negative threshold voltage.

In case the chip per se performs a test automatically, the flag bit "0" is written as a result of such auto-test. Alternatively in case the test is done by use of a tester, data will be externally loaded in accordance with the test results, followed by execution of writing. If the flag bit is "1", then such data will no longer be reflected on any operations to be later executed. If the flag bit is "0", then the data will be reflected on the later-executed operations.

Figures 10A, 10B:
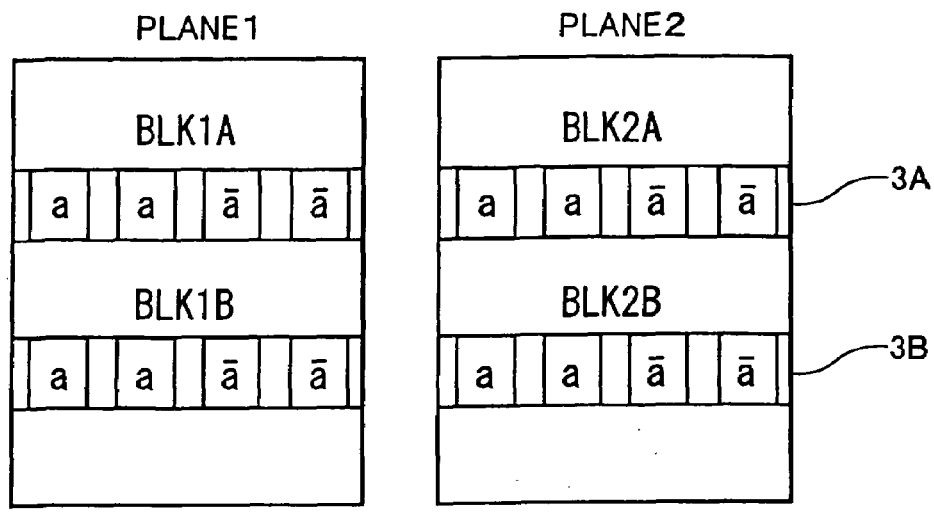
FIGS. 10A and 10B are diagrams each showing a data storage format of the ini data storage blocks.

Further precisely, as shown in FIGS. 10A and 10B, the ini data blocks 3A, 3B are arranged so that each is divided into pages: even-numbered pages which consist of the range of even-numbered bit lines (BLE), and odd-numbered pages consisting of the range of odd-numbered bit lines (BLO). And, let the status data indicative of whether the block 3A, 3B is normal or defective be stored in the even-numbered pages. Additionally a defect column address of defect addresses is stored in the even-numbered pages whereas a defect row address and other optional data items are stored together in the odd-numbered pages.

All the data items written into the even- and odd-numbered pages are to be held as a combination or "set" of complementary data segments "a" and "a(Bar)" which will be represented by "/a" for clarity purposes in the rest of the description. Note here that data segments a, /a are each of 1 byte (with 7-bit net data included therein), as discussed previously in conjunction with FIG. 9. More specifically, for a="1, 1, 1, 1, 0, 0, 0", let /a="0, 0, 0, 0, 1, 1, 1". Satisfying this relationship of the complementary data a, /a, the judgment "block is normal" is done if in the case of the status data; if in the initial setup data, it will be utilizable as "valid data." Using as a set the data segments-exhibiting such complementary relationship makes it possible to facilitate the intended good/bad or "pass/fail" check procedure of the initial setup data of interest when sending the initial setup data toward the operating condition setter circuit stated supra.

In FIG. 10A, there is exemplarily shown only one defective column address data as included in several data items being stored in even-numbered pages. As shown herein, while one set of data satisfies the complementary relationship of "a, /a", four sets of identical data are written into different column address positions respectively. On the other hand, regarding defective row address data (actually, defective cell block address data) to be stored in odd-numbered pages, two sets of identical defective cell block address data each consisting of the complementary data items of a, /a are written at different column address positions. This is as a result of taking into consideration the fact that initial setup data will be first read out of an even-numbered pages for execution of the initialization required.

More specifically, at the stage of reading the even-page initial setup data, the defective column address data has already been stored therein; however, defective column replacement or substitution has not yet been performed, which suggests that it may contain a defective column with increased possibility. Due to this, four sets of defective column address data are prepared in advance. In contrast, at the stage of odd-page reading, defective column substitution is done based on the defective column address data as has already been read; thus, a less number of sets of defective block address data may be required. Nevertheless, two defective block address data sets are prepared in this embodiment because the presence of any possible risks is taken into consideration as to degradation of the memory cell characteristics occurrable after product shipment to markets.

More generically, N (where "N" is a positive integer) sets of status data and N sets of defective column address data—each set satisfies the complementary relationship—are programmed into even-numbered pages; similarly, M (where "M" is a positive integer less than "N") sets of defective row address data, each of which satisfies the complementary relation, are programmed into odd-numbered pages. With such an ini data region arrangement, it becomes possible, in an initializing operation with the "even-page first read" feature, to equivalently guarantee the availability of both the even-page data that can contain a defect(s) with higher possibility and the data upon reading of odd pages with defect replacement control being provided as a result of such even-page data reading.

Figure 11:
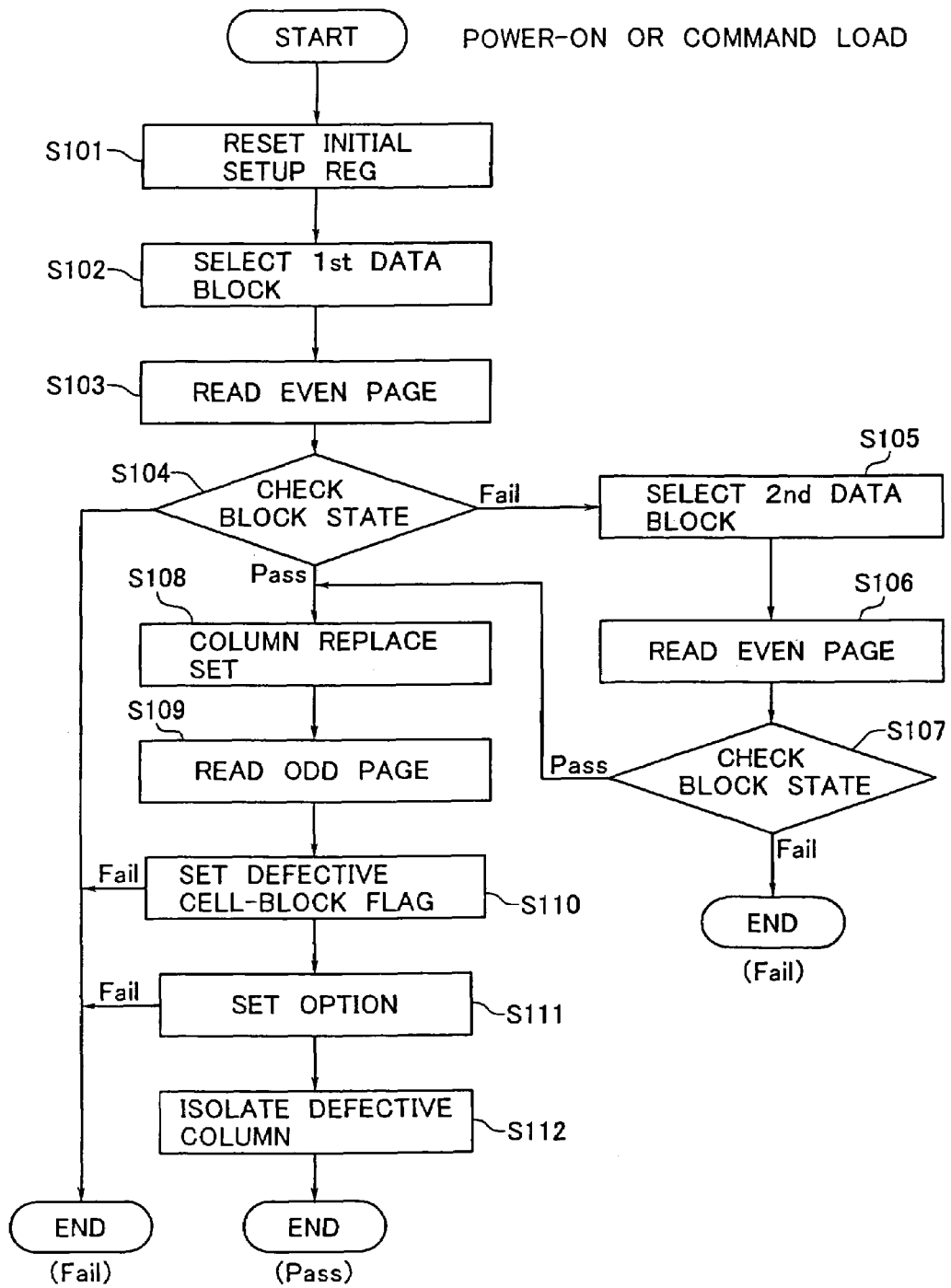
FIG. 11 is a diagram showing a flow of an initialization operation based on data of the ini data blocks.

Referring next to FIG. 11, there is shown an operation flow of initialization procedure using the initial setup data as read out of the ini data storage region 3. This operation gets started automatically upon detection of power-on by the chip or, alternatively, when loading a command "FF" for initialization. In case this "FF" command is also utilized for ordinary memory operations (write, read and erase), the control circuit 11 may be programmed to judge the "FF" command which first incomes immediately after powerup as a read command for initialization.

Upon startup of the initialization operation, the procedure of FIG. 11 goes to step S101, which resets those registers used for initialization: the defect address register 13, voltage setup register 15, and chip information register 16 shown in FIG. 1. Then, at step S102, select the first data block 3A of the ini data region 3; next at step S103, read data out of even-numbered pages in block 3A into the data sense circuit 5.

The procedure goes next to step S104 which uses the status data extracted from the even-page data to determine or "judge" whether the data block of interest is normal in functionality. This judgment is made by utilizing the fact that the respective data items are stored as the complementary data set of "a", "/a" as previously discussed in conjunction with FIGS. 10A-B and then determining if such complementary relationship is satisfied.

Figure 12:
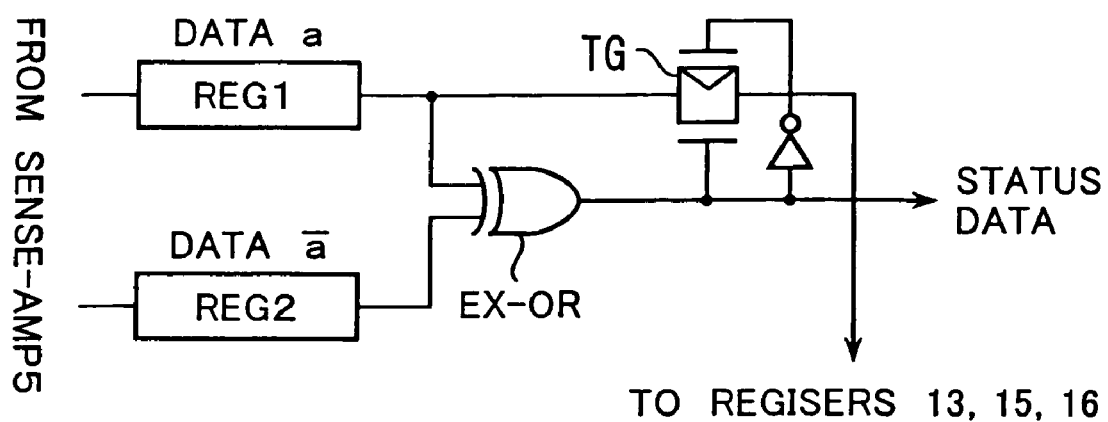
FIG. 12 is a diagram showing a configuration of circuitry which performs a "pass/fail" test to determine whether the initial setup data is normal or defective.

More specifically, as shown in FIG. 12, transfer data "a" toward a first register REG1 while sending data /a to a second register REG2; then, let the data of these registers REG1, 2 be input to an exclusive-OR gate EX-OR. If the data successfully satisfies the complementary relation of a and /a, then a binary bit "1" is obtainable from the Ex-OR gate to indicate that the block of interest is normal; if fail then a "0" is output indicating that the block is defective. That is, an output of this Ex-OR gate is adaptable for use as the status data output required.

The "valid/invalid" check of the remaining initial setup data items other than the status data, such as defect address data or the like, will also be done using a similar logic. And, as shown in FIG. 12, when the Ex-OR gate's output is a logic "1," a transfer gate TG as controlled thereby is used to transfer as valid data the output of register REG1 to respective corresponding initialization registers.

The valid/invalid check operation executed by the circuitry of FIG. 12 is actually done within the control circuit 11 shown in FIG. 1. As previously stated, the even-numbered pages are each provided with four sets of identical data on the assumption that defects can occur therein. Accordingly, sufficiency is felt whenever only one of these four data sets is affirmed to satisfy the above-noted complementary relationship. Note that during testing, the above procedure is modifiable to issue the judgment of "normal" in the event that more than two sets of the four status data sets are affirmed to satisfy the complementary relationship, by way of example.

At step S104 of FIG. 11, if the first ini data block 3A is determined to be defective, then the procedure goes to step S105 which selects the second ini data block 3B. Then at step S106, read even-page data in a way similar to that at the previous step S103. Next at step S107, use the read data to determine whether the data block of interest is normal or not. If second block 3B is also judged defective then determine the chip per se is defective. In this case the system procedure is terminated without performing any initialization operation.

If at step S104, the first ini data block 3A is found normal, then the procedure goes to step S108 which performs based on the data the initialization for defective column replacement. Alternatively, if first data block 3A is found defective at step S104 whereas second block 3B is verified to be normal at step S107, then use defective column address data as read out of the even page of this second block 3B to execute the initialization for defective column replacement at step S108. More specifically, let the defective column address data be sent to the defect address register 13 of FIG.

1. Whereby, in the memory's read/write operations to be done thereafter, an attempt is made to detect coincidence between an externally supplied address and the defective column address. If such coincidence is detected then control is provided to replace a defective column select line with a spare column select line at the column decoder 7.

It should be noted that at this step S108 also, judgment is made as to the validity of the defective column data thus read using similar logic to that as has been explained in conjunction with FIG. 12, causing valid data to be sent toward the register concerned. Accordingly, if all of the four defective column address data sets fail to satisfy the above-noted complementary relationship, then the procedure is ended without performing any initialization operation while determining that the chip is defective.

After having successfully completed the initialization for defective column replacement at step. S108 of FIG. 11, the procedure goes next to step S109 which reads odd-page data of the ini data block that was judged normal. Then at step S110, use the valid defective cell block address data to set a flag indicative of defectiveness with respect to a defective cell block. More precisely, flag data will be written into a data latch circuit 42 as provided in the row decoder 4 corresponding to such defective cell block for causing this cell block to be kept inactive at all times.

The defective cell block address may be transferred to the defect address register 13 simultaneously. Note here that the illustrative embodiment offers no defective-row substitution controllabilities.

At step S111, let option data such as voltage setup data and others be also sent to the peripheral setup registers 15, 16. At these steps also, the data validity check is done based on the above-stated complementary relationship. If every two-set data fails to satisfy the complementary relation then the procedure is ended without performing any initialization operation, while determining the chip per se to be a defective product.

After completion of the valid data transfer to each initial setup register, the procedure proceeds to step S112 which performs separation or isolation of a sense amplifier associated with the defective column, by making it inactive. More specifically, as shown in FIG. 7, write data into certain one of the data latch circuits 52 provided in units of 8-bit sense amp clusters, thereby causing a specific sense-amp cluster of the defective column to be kept inactive. After having completed the above processing, the initialization operation is terminated.

Figure 13:
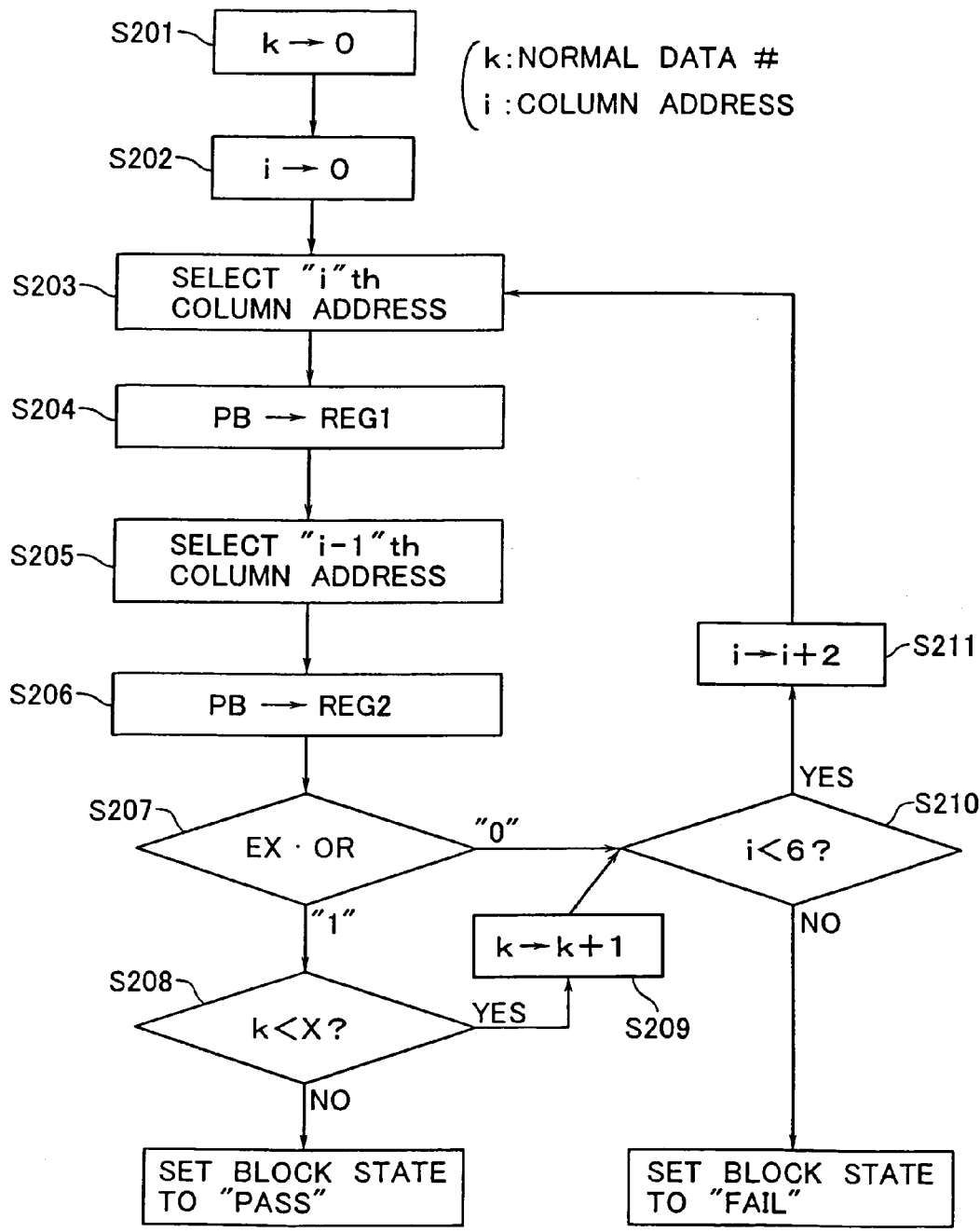
FIG. 13 is a flow diagram of a status data readout operation at the ini data blocks.

FIG. 13 shows a detailed flow of the block state check steps S104, S107 in FIG. 11. Principally the check logic stated in conjunction with FIG. 12 is utilized. The routine of FIG. 13 starts with step S201 which initializes the normal data number "k"; then, initialize the column address at step S202, followed by step S203 which selects the top column (i=0) to thereby read the data "a" of the ini data block. Then, go to step S204 which identifies the data as read into a data sense circuit (page buffer PB) and transfers it to the first register REG1 of FIG. 12.

Similarly, at step S205, select the next column (i=1) to read data "/a"; then, at step S206, send such read data to the second register REG2. And at step S207, perform an exclusive OR between the data of first register REG1 and that of second register REG2, thereby checking whether the data is good or not. If the check data is a logical "0" (defective), then the routine jumps to step S210 which verifies whether the column address falls within a range of "i<6". If YES, then go to step S211 which updates the column address to "i+2" and thereafter return to step S203. Alternatively, if the check data is a "1" (normal), then go to step S208 which determines whether the data number "k" is less than a predefined value "x." If YES then go to step S269 which updates the value k to "k+1"; then proceed to step S210 for repeated execution of the column address updating processing stated above. Thereafter, a similar operation will be repeated.

If NO at step S208, that is, when the normal data number "k" is ascertained to be greater than or equal to the predefined value "x", then set the block state to "Pass" (normal), followed by termination of this system routine. Even after repeated execution of the check process while updating the column address, the normal data number can stay less than the value x. If this is the case, set the block state to "Fail" (defective); then, exit the routine.

Note here that the value x is set to x=0 upon ordinary power-on or alternatively during the "FF" command-based initializing operation. More specifically, in case at least one normal data is found until establishment of a column address i=6 for selection of four data sets, the routine ends with the determination of chip normality. If all the four data sets are defective then determine that the chip is defective.

On the other hand, during testing, input a status data read command and then set x=1. At this time, make sure that the four "a, /a" data sets include two normal sets; then, the setting of "Pass" is to be done. With such an arrangement, it is possible to guarantee the normality of such two data sets upon shipment of the memory chip as a product to the market. And, even where one data set will become defective after the product shipment, the chip is guaranteed to be handleable as a normal product.

Figure 14:
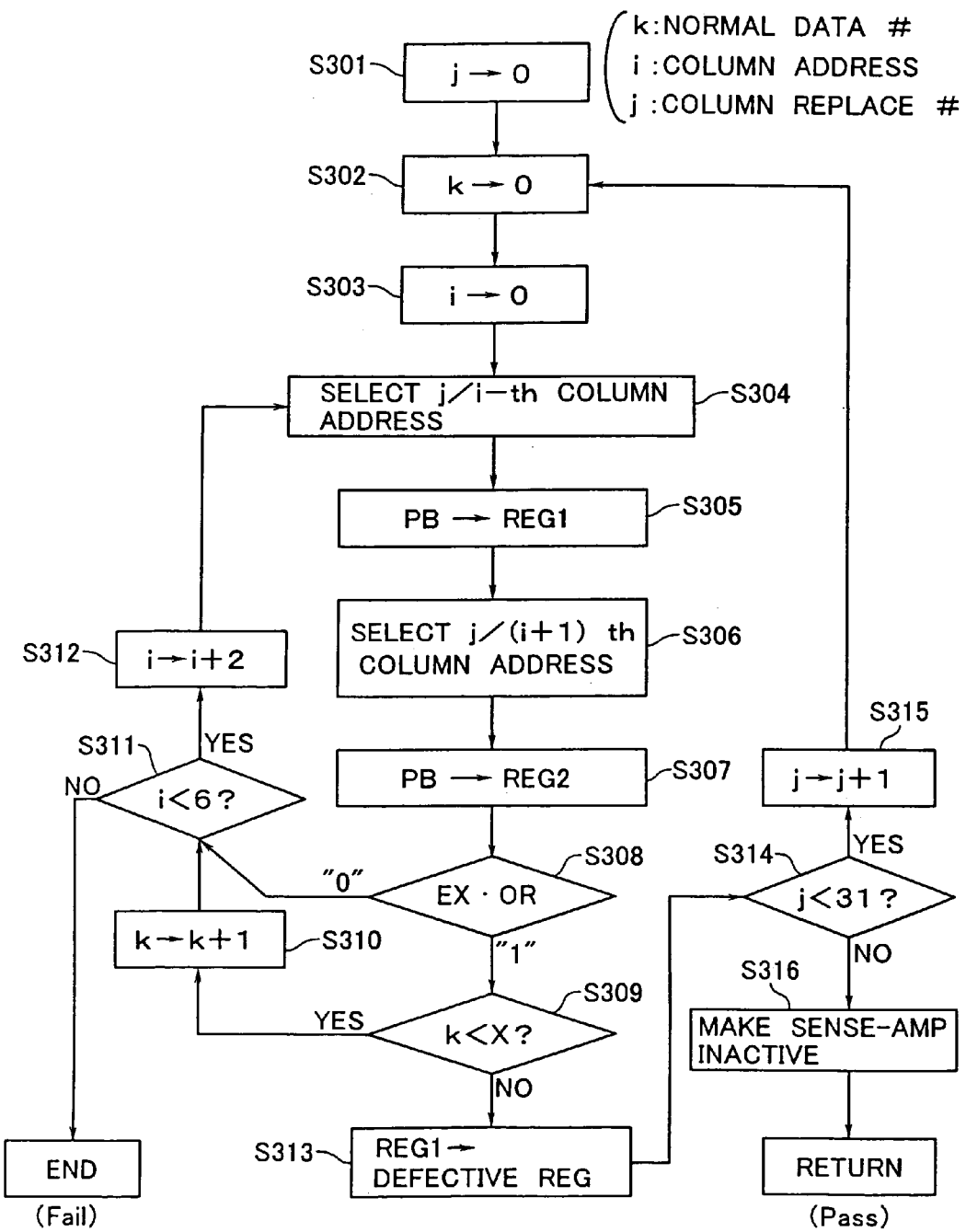
FIG. 14 is a flow chart of a column redundancy operation based on data of the ini data blocks.

Turning to FIG. 14, there is depicted a practically implementable operation flow of the column replace/setting step S108 shown in FIG. 11. This flowchart assumes that defects of eight (8) columns per plane of the memory cell array 1 and thus sixteen (16) columns for two planes are replaceable. The routine shown herein starts with step S301, which initializes a number "j" that is two times greater than the number of defective column addresses (because two bytes are required to represent a single defective column address). The routine goes next to step S302 which initializes the normal data number "k"; then, at step S303, initialize the column address. Then, at step S304, select a top column (i=0) and then read defective column address data "a" of ini data block. Next at step S305, transfer the data read into a data sense circuit (page buffer PB) toward the first register REG1.

Similarly at step S306, select the next column (i=1) to read defective column address data "/a"; then, at step S307, transfer such data to the second register. REG2. Then at step S308, perform an exclusive OR between the data of first register REG1 and that of second register REG2 to thereby perform data "good/bad." check. If the resultant check data is a "0" (defective), then the routine jumps to step S311 which determines whether the column address is within a range of "i<6". If YES then update the column address to "i+2" at step S312 and thereafter return to step S304. If the check data is a "1" (normal) at step S308 then go to step S309 which determines if the data number "k" is less than a preset value "x". If YES then go to step S310 which updates the value k to "k+1". Thereafter, similar column address updating will be performed, followed by repeated execution of a similar operation.

And at step S309, judgment is made to verify that the normal data number "k" is not less than the preset value "x". Even after repeated execution of the check process while updating the column address, the normal data number can stay less than the value x. If this is the case, set it to "Fail" (defective); then, exit the routine. If it is affirmed that the normal data number k is not less than value x then go to step S313 which transfers the presently available defective column address data from first register REG1 to the defect address register 13 shown in FIG. 1.

Then at step S314, verify that a defective column replace number is less than 16 (i.e. j<31). If YES then go to step S315 which updates the defective column number j, followed by repeated execution of a similar operation. If NO then go to step S316 which performs processing for making the defective column's sense amplifier inactive, followed by termination of the initialization operation for defective column replacement.

In ordinary power-on events or, alternatively, during reading in response to the "FF" command, let the value x be x=0. More specifically, whenever at least one defective column address data set is present, judgment of "valid" is made causing defective column replacing initialization to be done based on the data of first register REG1 (this may alternatively be second register REG2).

On the other hand, upon inputting of a column defect replace command during testing, let the value x be x=1 and then permit execution of the operation control of FIG. 14. In this case, make sure that the four "a, /a" data sets include two or more normal sets; then, perform the initialization for column replacement. With such an arrangement, it is possible to affirm the normal state of such more than two defective column address data sets in response to the column defect replace command, which in turn makes it possible to guarantee the normality of two data sets upon shipment of the memory chip product. And, even where one data set becomes defective after the product shipment, it will be guaranteed that the chip is successfully initializable through reading of defective column address data.

In the above-discussed defective column replacing initialization operation, the defective column address data may alternatively be sent to the defect address register 13 of peripheral circuitry under an assumption that the defective column address data is valid without regard to the flag bit. The reason of this is as follows. Defective column replacement is actually done based on the data of defective column address register 13; thus, when detecting coincidence between a defective address stored in this defective column register 13 and an externally supplied address, it is permissible that any invalid data with its flag bit of "1" is ignored while handling it as valid data only when the flag bit is "0". Note that each data may be transferred only when its flag bit is "0" (valid) as in the case of defective block flag setup and/or option settings as will next be discussed below.

Figure 15:
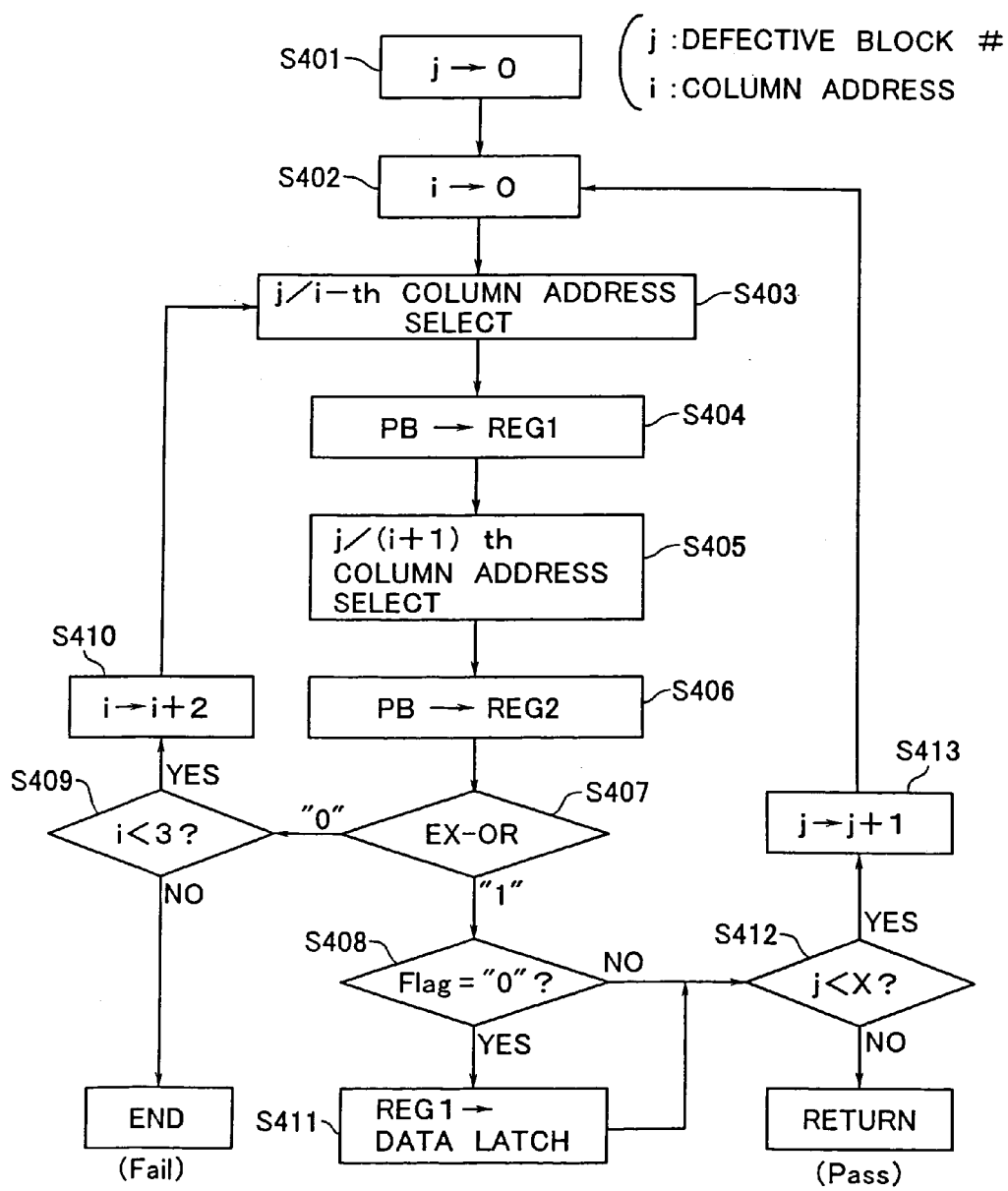
FIG. 15 is a flowchart of a defective block flag setting operation using the storage block data.

Referring to FIG. 15, there is shown an operation flow of the defective cell block flag setup step S110 in FIG. 11. An operation flow of the option setup step S111 is similar thereto in principle. First, at step S401, initialize the defective block number "j". Then at step S402, initialize column address "i". Next at step S403, select the top column (i=0) to read defective row address data "a" of ini data block. And at step. S404, transfer the data read into a data sense circuit (page buffer PB) toward the first register REG1.

Similarly, select the next column (i=1) and read defective row address data "/a" at step S405; then, at step S406, send the data to second register REG2. And at step S407, perform an exclusive OR between the data of first register REG1 and that of second register REG2 to thereby determine whether the data is good or bad—say, "pass/fail" check. If the check result is a "0" (defective) then make sure that the column address falls within a range of "i<3" at step S409; then, at step S410, update the column address to "i+2" for selection of the next data set. A similar operation will be repeated thereafter. In view of the fact that the defective row address data is provided in the form of two sets as stated previously, if both of them are judged to suffer from data defects at step S409, the processing ends with a decision of chip defect "Fail."

If the check result at step S407 is "1" (normal), then go to step S408 which detects the flag bit of each defective block address data. If the flag bit is "0" (normal) then transfer such flag bit data to the data latch circuit 42 as provided in block selector circuit 41 of the row decoder shown in FIG. 5. This data transfer is achievable by use of a special-purpose command. Whereby, the defective cell block's flag setup is completed; thereafter, this defective cell block will be kept inactive. The defective row address data may also be concurrently sent to and stored in the defective address register 13.

And at step S412, ascertain that the defective block number "j" stays less than a preset value "x"; then, at step S413, update the value "j". Thereafter a similar operation will be repeated. If the defective block number j is not less than value x, then terminate the defective block flag setting operation with "Pass" established thereto. More specifically, in case the block address is represented by two bytes, the value "x+1" will be set at a specific value that is two times greater than an allowable defective block number.

While the setting of the remaining option data will also be done in a similar flow as stated previously, these defective block flag setting and option data setup operations may automatically be performed sequentially in response to input of a certain command; alternatively, these may be designed to operate in response to input of independent commands, respectively.

An explanation will next be given of an operation of writing initial setup data into the ini data blocks 3A, 3B. This initial setup data writing will be different in procedure between when the memory chip performs an automated test and when the chip does not perform such auto-test.

Figure 16:
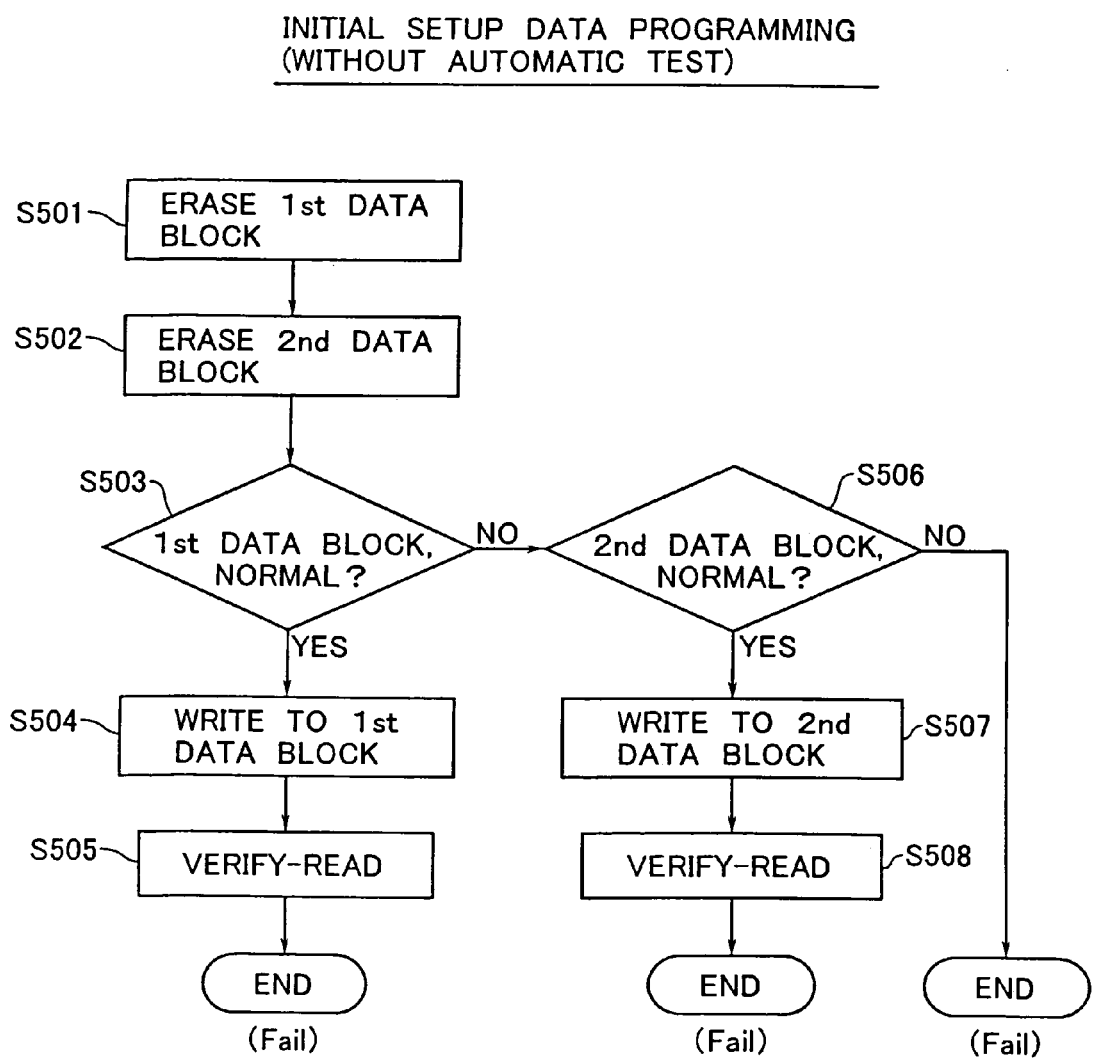
FIG. 16 is a flowchart of a write operation of the ini data storage blocks.

FIG. 16 is a flow diagram in the case of writing into the ini data blocks 3A, 3B through testing using a memory tester, without performing any auto-test. The illustrative write routine starts with step S501 which inputs an erase command by the memory tester to the EEPROM and then erases the entirety of first ini data block 3A at a time: this is called the "all-at-a-time" or "all-at-once" erase. Then at step S502, apply the all-at-once erase to second block 3B.

Thereafter, at step S503, determine based on status data whether the first ini data block 3A is normal. If normal, then go to step S504 which writes into first block 3A respective initial setup data items typically including a defect address (es). At step S505, perform verify-reading of the written data. If successful write completion is affirmed then the routine ends with "Pass" being set to the chip state. If the write operation is in fail then the routine ends with "Fail"; alternatively, the routine may jump to the step of writing second ini data block 3B.

If at step S503 the first ini data block 3A is found defective, then the routine proceeds to step S506 which determines whether the second ini data block 3B is normal or not. If NO at step S506 then exit the routine while determining this chip is defective. If YES at step S506 then go to step S507 which writes into second block 3B respective initial setup data items including a defect address(es). And at step S508, let the written data be subject to verify-reading. If write completion is affirmed then the routine ends with "Pass" being set to the chip state. If the write is failed then the routine ends with "Fail."

It must be noted that the verify-read operations at steps S505, S508 are executable in response to input of "FF" command for example. An alternative approach to obtaining similar results is to employ a scheme for deactivating the power supply and thereafter again activating the power to thereby perform automatic reading within the chip upon detection of such re-powerup.

Figure 17:
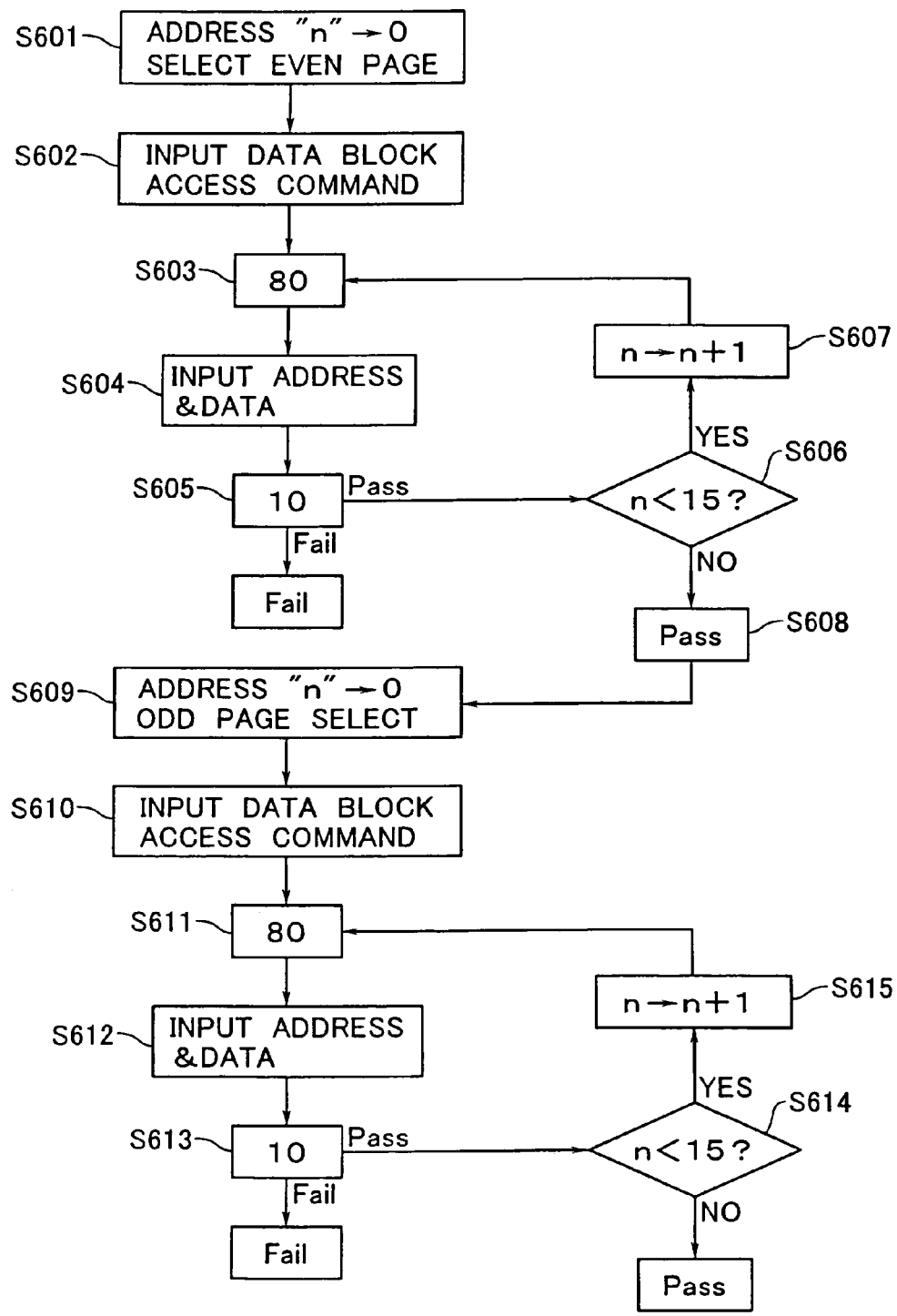
FIG. 17 is a diagram showing a detailed operation flow of the write step of FIG. 16.

Referring next to FIG. 17, there is shown a detailed flow of the operations at the data write steps S504, S507 in FIG. 16. The routine shown herein starts with step S601 which initializes an address "n" within a cell block (i.e. row address for execution of wordline selection) and then select even-numbered pages (i.e. even-numbered bit lines BLE). The routine goes next to step S602 which permits inputting of a command for access to ini data block. And, through a series of operations at step S603 for input of "80" and at step S604 for address/data entry plus at step S605 for input of "10", writing is done to the even page as selected by a single word line.

The data writing here is due to repeated execution of a write pulse voltage applying operation and a verify-read operation, as in ordinary data writing. Additionally the initial setup data may be multiple sets of complementary data determinable by a column address as discussed previously. If writing is in fail then let the write operation be ended with "Fail." If successful completion of writing is verified, then go to step S606 which determines whether the address "n" is less than "15" in case a single cell block consists of sixteen (16) pages (n=0, 1, 2, . . . , 15). If YES at step S606 then go to step S607 which updates the address "n" to "n+1," followed by a similar write operation relative to the next page (i.e. next word line). Thereafter a similar operation will be repeated. As previously stated in conjunction with FIG. 9, the initial setup data is such that 1-bit data is obtainable in the event that all the sixteen binary bits are at "0" or all such bits are "1"; thus, the same data will be written again and again during this write operation.

If NO at step S606, then the routine goes to step S608 which sets "Pass" to the even page writing. Then at step S609, perform odd-page selection for again initializing the address "n". And, through a series of operations at step S610 for input of an access command of the ini data block, at step S611 for input of "180", at step S612 for address/data entry and at step S613 for input of "10", writing is done to the odd page as selected by a single word line.

If writing is failed then let the write operation be interrupted with "Fail". If sufficient writing was done completely, then go to step S614 which determines whether the address "n" stays less than "15". If YES then go to step S615 which updates address "n" to "n+1", followed by a similar write operation relative to the next page (i.e. next word line). A similar operation will be repeated thereafter causing the same data to be written into all available pages within the block as selected by sixteen word lines.

An explanation will next be given of the case where the memory chip performs auto-test. In this case, the autotest is for determination of whether each ini data block is normal or not. If a defective block is found, then set a flag indicating that such is defective within the row decoder while letting this block be in non-select or "unselect" state. Consequently, in case certain ini data block of the chip is defective, no writing is applied thereto even upon inputting of an initial setup data write command; the ini data wiring is done only when such block stays normal.

Figure 18:
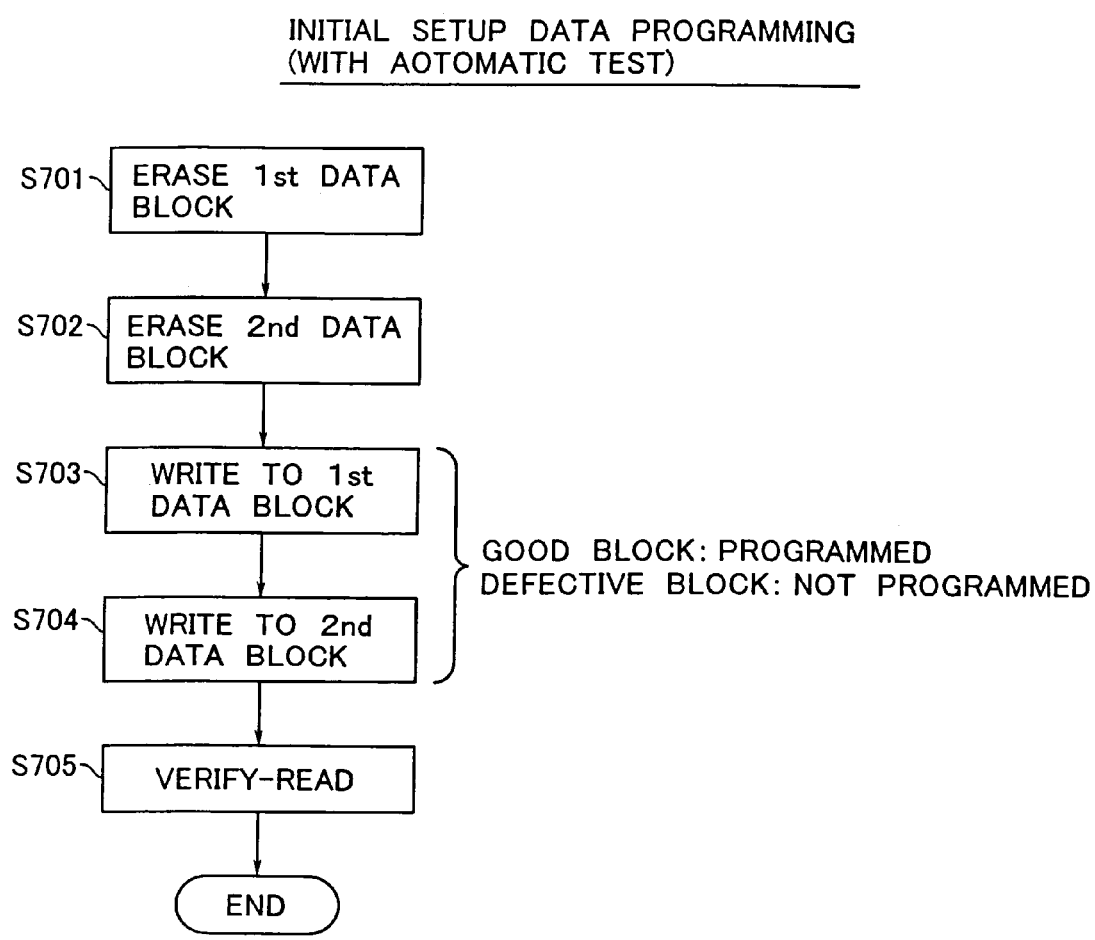
FIG. 18 is a flowchart of another write operation of the initial setup data storage blocks.

An operation flow of the autotest-assisted ini data block wiring is shown in FIG. 18. This operation starts with step S701 which is responsive to input of an erase command to the memory chip-due to testing, for executing all-at-a-time erase of the first ini data block 3A. Then at step S702, let the second ini data block 3B be subject to all-at-once erasing.

Then at step S703, input a command for writing to the first ini data block 3A and then perform writing thereinto. Next at step S704, input a command for writing to the second in data block 3B and then perform writing thereinto. As previously stated, writing is done only to defect-free or "normal" one of these data blocks 3A, 3B.

Next at step S705, perform verify-reading of once-written data. If write completion is verified successfully then exit the routine while letting the chip state be "Pass". If writing is failed then exit it with "Fail". This verify-read operation at step S705 is executable in response to input of the "FF" command for example. An alternative approach is to employ the scheme for deactivating the power supply and thereafter reactivating the power to thereby perform reading automatically within the chip upon detection of such repowerup.

Figure 19:
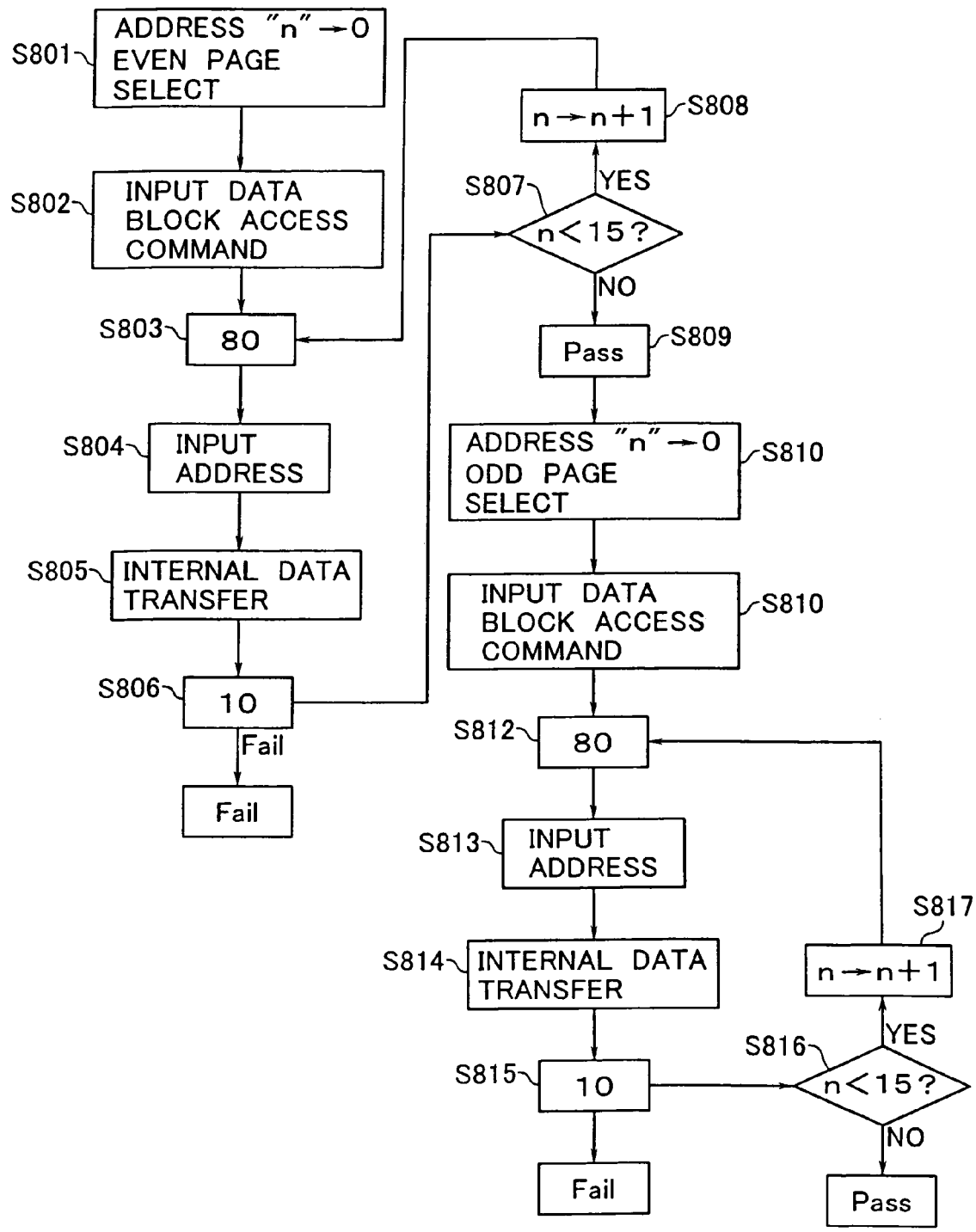
FIG. 19 is a diagram showing a detailed operation flow of the write step of FIG. 18.

A detailed flow of the write operations at steps S703 and S704 of FIG. 18 is shown in FIG. 19. First, at step S801, initialize the address "n" within a NAND cell block (row address for wordline selection); then select even pages (i.e. even-numbered bit lines BLE). Then at step S802, input an ini data block access command. Next, input "80" at step S803; input a block address of first ini data block 3A at step S804; thereafter, input a data load command for internal data transfer at step S805. More specifically, the data to be written (defective column address data) has already been written into the defect address register 13 through auto-test procedure; thus, read it for internal transfer toward the data sense circuit 5 stated supra.

And at step S806, perform writing due to inputting of "10"; then, writing is done to the even pages as selected by a single word line. The data writing is due to repeated execution of a write pulse voltage applying operation and a verify-read operation, as in ordinary data writing. In addition, the initial setup data may be multiple sets of complementary data determinable by a column address as described previously. If writing is failed then let the write operation be ended with "Fail".

If successful completion of writing is verified, then go to step S807 which determines whether the address "n" is less than "15" in case one cell block consists of 16 wordlines (n=0, 1, 2, . . . , 15). If YES then go to step S808 which updates the address "n", followed by a similar write operation relative to the next word line. Thereafter a similar operation will be repeated. As previously explained in conjunction with FIG. 9, the initial setup data is such that 1-bit data is obtainable in the event that all the 16 bits are at "0" or all such bits are "1"; thus, the same data will be written iteratively during this write operation.

At step S809, if the even-pages wiring becomes "Pass" then go to step S810 which again initializes the address "n" and then performs odd-pages selection. Then at step S811, input an ini data block access command; at step S812, input "80"; at step S813, input a block address of second ini data block 3B; then, at step S814, input a data load command for execution of internal data transfer. In view of the fact that the data being written (defective row address data and other option data) have already been written through the test into the defective block's latch circuit 42, defect address register 13, voltage setup register 15 or else, read these data items for internal transfer to the sense amplifier circuit 5.

And, in responding to input of "10" at step S815, writing is done causing the odd-pages as selected by a single word line to undergo writing. If such writing is failed then interrupt the write operation with "Fail". If successful completion of writing is verified, then go to step S816 which determines whether the address "n" is less than "15". If YES then proceed to step S817 which updates address "n"; next, perform similar writing with respect to the next wordline. Through repeated execution of similar operations, the same data will be finally written into all cells available within the block as selected by sixteen wordlines.

While the invention has been described with reference to the specific embodiments, the description is illustrative of the invention and is not to be construed as limiting the invention. Although the illustrative embodiment is for use as the NAND type EEPROM chip, the principles of this invention may also be applicable to other types of semiconductor memory devices including, but not limited to, EEPROMs of the NOR type, AND type and DINOR type as well as EPROMs and mask ROMs employing nonvolatile data storable memory cells without electrically rewitabilities.

As apparent from the foregoing, in accordance with this invention, it is possible to obtain an improved nonvolatile semiconductor memory device capable of successfully achieving initialization of operating conditions, such as defect address replacement, through writing of initial setup data such as defect addresses or the like within the memory cell array thereof, without employing any extra fuse circuitry.

What is claimed is:

1. A non-volatile semiconductor memory comprising:
a memory cell array having a plurality of non-volatile memory cells, a plurality of said memory cells being connected in series to form a NAND cell unit;
a decode circuit configured to decode address data and to select a memory cell of said memory cell array; and
a data sense circuit configured to sense and amplify data of the selected memory cell of said memory cell array,
wherein initialization of operating conditions are performed based on data stored in part of the memory cell array upon power being on, and 1-bit data of said data stored is stored by writing "1" to all of the memory cells in one of said NAND cell unit, or "0" to all of the memory cells in one of said NAND cell unit.

2. The non-volatile semiconductor memory according to claim 1, wherein said initialization is performed by reading initial set up data stored in a part of the memory cell array.

3. The non-volatile semiconductor memory according to claim 1, wherein said data includes data relating to defective address data.

4. The non-volatile semiconductor memory according to claim 3, wherein as for defective columns corresponding to said defective address data, control is done to inactivate said data sense circuit of said defective columns.

5. The non-volatile semiconductor memory according to claim 1, wherein said data includes data relating to storage capacity of said memory cell array.

6. The non-volatile semiconductor memory according to claim 1, wherein said data is complementary data.

7. The non-volatile semiconductor memory according to claim 1, wherein said memory cell array includes an initial setup data region for holding said data.

8. The non-volatile semiconductor memory according to claim 7, further comprising a register configured to store therein said data as read out of said initial setup data region.

9. The non-volatile semiconductor memory according to claim 8, further comprising a control circuit configured to read data from said initial setup data region and transfer the data to said register.

10. A non-volatile semiconductor memory comprising:
a memory cell array having a plurality of non-volatile memory cells, a plurality of said memory cells being connected in series to form a NAND cell unit;
a decode circuit configured to decode address data and to select a memory cell of said memory cell array; and
a data sense circuit configured to sense and amplify data of the selected memory cell of said memory cell array,
wherein initialization of operating conditions are performed based on data stored in a part of the memory cell array upon a conmiand being provided, and 1-bit data of said data stored is stored by writing "1" to all of the memory cells in one of said NAND cell unit, or "0" to all of the memory cells in one of said NAND cell unit.

11. The non-volatile semiconductor memory according to claim 10, wherein said initialization is performed by reading initial set up data stored in a part of the memory cell array.

12. The non-volatile semiconductor memory according to claim 10, wherein said data includes data of defective address data.

13. The non-volatile semiconductor memory according to claim 12, wherein as for defective columns corresponding to said defective address data, control is done to inactivate said data sense circuit of said defective columns.

14. The non-volatile semiconductor memory according to claim 10 wherein said data includes data relating to storage capacity of said memory cell array.

15. The non-volatile semiconductor memory according to claim 10, wherein said memory cell array is NAND type EEPROM.

16. The non-volatile semiconductor memory according to claim 10, wherein said memory cell array includes an initial setup data region for holding said data.

17. The non-volatile semiconductor memory according to claim 16, further comprising a register configured to store therein said data as read out of said initial setup data region.

18. The non-volatile semiconductor memory according to claim 17, further comprising a control circuit configured to read data from said initial setup data region and transfer the data to said register.

* * * * *